United States Patent
Choi et al.

(10) Patent No.: US 6,740,550 B2
(45) Date of Patent: May 25, 2004

(54) METHODS OF MANUFACTURING SEMICONDUCTOR DEVICES HAVING CHAMFERED SILICIDE LAYERS THEREIN

(75) Inventors: Chang-won Choi, Seoul (KR); Dae-hyuk Chung, Kyungki-do (KR); Woo-sik Kim, Seoul (KR); Shin-woo Nam, Kyungki-do (KR); Yeo-cheol Yoon, Seoul (KR); Bum-su Kim, Kyungki-do (KR); Jong-ho Park, Seoul (KR); Ji-hwan Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/190,086

(22) Filed: Jul. 3, 2002

(65) Prior Publication Data

US 2002/0175381 A1 Nov. 28, 2002

Related U.S. Application Data

(62) Division of application No. 09/536,427, filed on Mar. 27, 2000, now Pat. No. 6,437,411.

(30) Foreign Application Priority Data

Mar. 29, 1999 (KR) ............................................ 99-10797
Jul. 22, 1999 (KR) ............................................ 99-29731

(51) Int. Cl.[7] ......................................... H01L 21/8238
(52) U.S. Cl. ....................... 438/199; 438/592; 438/738; 438/744
(58) Field of Search ........................ 438/199, 592–595, 438/588, 738–744, 151; 257/413, 306, 316, 529

(56) References Cited

U.S. PATENT DOCUMENTS 4,285,761 A  8/1981 Fatula, Jr. et al. .......... 156/628

(List continued on next page.)

OTHER PUBLICATIONS

S. Wolf & R. Tauber, Silicon Processing For The VLSI Era, vol. I: Process Technology 384–388 (1986).

Mayer et al., "Electronic Materials Science for Integrated Circuits in Si and GaAs," Macmillan Publishing Company, New York, New York, pp.1 294–295 (1990).

Primary Examiner—Carl Whitehead, Jr.
Assistant Examiner—Yennhu B Huynh
(74) Attorney, Agent, or Firm—Myers Bigel Sibley & Sajovec

(57) ABSTRACT

A semiconductor device having a chamfered silicide layer and a manufacturing method of the same. The semiconductor device includes: a first insulation layer overlying a semiconductor substrate; gate structures including first conductive layer patterns formed on the first insulation layer, and second conductive layer patterns which are formed on the first conductive layer patterns, wherein the lower sides of the second conductive layer patterns are substantially perpendicular to the major surface of the semiconductor substrate and the upper sides of the second conductive layer patterns are chamfered; and a second insulation layer formed with a first width W on the second conductive layer patterns, wherein the sidewalls of the second insulation layer overhang the upper edges of the second conductive layer patterns. In the semiconductor device manufacture, in forming undercut regions which define the chamfered upper edges of the metal silicide layer patterns, isotropic dry etching is carried out, wherein the isotropic dry etching can be performed simultaneously with ashing of photoresist patterns, or immediately after the ashing process in the same chamber. In either case, after the ashing of the photoresist patterns, an isotropic wet etching can be carried out immediately after performing an existing stripping process, so as to form the undercut regions.

12 Claims, 22 Drawing Sheets

U.S. PATENT DOCUMENTS

| | | | | |
|---|---|---|---|---|
| 4,319,395 A | | 3/1982 | Lund et al. | 29/571 |
| 4,914,056 A | | 4/1990 | Okumura | 437/192 |
| 5,262,352 A | * | 11/1993 | Woo et al. | 437/189 |
| 5,491,100 A | * | 2/1996 | Lee et al. | 437/41 |
| 5,491,110 A | | 2/1996 | Fehr et al. | 437/206 |
| 5,502,336 A | * | 3/1996 | Park et al. | 257/754 |
| 5,541,131 A | | 7/1996 | Yoo et al. | 437/44 |
| 5,591,670 A | | 1/1997 | Park et al. | 437/187 |
| 5,698,072 A | | 12/1997 | Fukuda | 156/653.1 |
| 5,751,048 A | | 5/1998 | Lee et al. | 257/412 |
| 5,811,335 A | | 9/1998 | Santangelo et al. | 438/268 |
| 5,814,537 A | | 9/1998 | Maa et al. | 438/151 |
| 5,856,239 A | | 1/1999 | Bashir et al. | 438/738 |
| 5,933,757 A | | 8/1999 | Yoshikawa et al. | 438/682 |
| 5,994,192 A | | 11/1999 | Chen | 438/303 |
| 6,001,719 A | | 12/1999 | Cho et al. | 438/592 |
| 6,069,379 A | | 5/2000 | Kimura et al. | 257/306 |
| 6,235,621 B1 | * | 5/2001 | Jeng et al. | 438/592 |
| 6,262,458 B1 | | 7/2001 | Hu | 257/413 |
| 6,274,900 B1 | | 8/2001 | San et al. | 438/485 |

* cited by examiner

METHODS OF MANUFACTURING SEMICONDUCTOR DEVICES HAVING CHAMFERED SILICIDE LAYERS THEREIN

This application is a divisional of prior application Ser. No. 09/536,427, filed Mar. 27, 2000 now U.S. Pat No. 6,437,411.

BACKGROUND OF THE INVENTION

1. Field of the Invention

The present invention relates to semiconductor devices and methods for manufacturing the same, and more particularly, to semiconductor devices having metal silicide conductive layers, semiconductor devices having contact plugs self-aligned with a lower structure which is comprised of the conductive layers, and a method for manufacturing the semiconductor devices.

2. Description of the Related Art

As the integration density of semiconductor devices continues to increase, distance from contact holes that connect lower and upper interconnection layers to surrounding interconnections, decreases with an increase in the aspect ratio of the contact holes. Thus, highly integrated semiconductor devices adopting a multilayered interconnection structure require more accurate and strict processing conditions in contact hole formation by using photolithography. In particular, in manufacturing semiconductor devices having a design rule of 0.25 $\mu$m or less, current lithography techniques are not sufficient to reproducibly perform desirable processes with the same accuracy.

In order to overcome limitations of photolithography in the formation of contact holes, a self-alignment technique has been suggested for forming contact holes. For example, a self-alignment technique has suggested nitride spacers be used as an etch stop layer in the formation of self-aligned contact holes.

In the conventional self-alignment technique, first a lower structure, for example, a conductive layer such as a gate electrode having a rectangular section, is formed on a semiconductor substrate via patterning by a general photolithography process, and then a layer of nitride is deposited on the entire surface of the conductive layer. Then, an etchback process is carried out on the resulting structure so as to form nitride spacers, and then interlayer dielectric (ILD) oxide films are formed thereon. Thereafter, a photoresist pattern is formed on the ILD films for exposing contact holes, and the exposed ILD films are etched to form self-aligned contact holes.

In the conventional self-aligned contact hole formation, the ILD films are etched with a high selectivity with respect to the nitride spacers to form the contact holes. During the etching process, carbon rich carbon fluoride gases capable of producing a large amount of polymer, for example, $C_4F_8$ or $C_5F_8$, are used so as to increase the selectivity.

However, if the etching conditions are determined to increase selectivity, the amount of polymer produced by the etching increases, so that the etching process may be interrupted, resulting in incomplete contact holes. Meanwhile, when the selectivity between the ILD films and the nitride spacers is decreased, complete contact holes can be formed without the interrupt due to the polymer. However, when the selectivity is low, the nitride spacers may be etched together with the ILD films during the etching process. Accordingly, the width of the remaining nitride spacers is too small to secure a desired insulation length from the sidewalls of conductive layers. Thus, it is prone to cause short between self-aligned contacts in the contact holes and the conductive layers.

In fabrication of highly integrated semiconductor devices having a design rule of 0.25 $\mu$m or less, when forming self-aligned contact holes over conductive layers such as gate electrodes or bit lines, which have an etch stop layer such as a nitride layer on the sidewalls thereof, an insulation thickness margin between the conductive layers and self-aligned contacts in the contact holes is not sufficient. A possible solution for overcoming this problem may be to lower the selectivity between ILD films and the etch stop layer in the self-aligned contact hole formation. However, the etch stop layer itself is removed or damaged with the low selectivity, so that it is difficult even to get a minimum insulation width at the edges of the conductive layer, increasing the possibility that the edges of the conductive layer directly be exposed to the contact holes.

Thus, in the self-aligned contact formation for manufacturing highly integrated semiconductor devices, the process margin is small even under optimal processing conditions, and thus it is difficult to reproducibly produce devices with the same accuracy.

SUMMARY OF THE INVENTION

It is an object of the present invention to provide semiconductor devices allowing an increased process margin, in which a desired insulation length between a lower conductive layer and self-aligned contacts can be ensured in self-aligned contact hole formation for manufacturing highly integrated semiconductor devices.

It is another object of the present invention to provide semiconductor devices having contact plugs self-aligned with a lower structure having the above configuration.

It is still another object of the present invention to provide methods for manufacturing the semiconductor devices.

In an embodiment, the present invention provides a semiconductor device comprising: a first insulation layer overlying a semiconductor substrate; gate structures including first conductive layer patterns formed on the first insulation layer, and second conductive layer patterns which are formed on the first conductive layer patterns, wherein the lower sides of the second conductive layer patterns are substantially perpendicular to the major surface of the semiconductor substrate and the upper sides of the second conductive layer patterns are chamfered; and a second insulation layer formed with a first width W on the second conductive layer patterns, wherein the sidewalls of the second insulation layer overhang the upper edges of the second conductive layer patterns.

Preferably, the semiconductor device further comprises contact plugs filling self-aligned contact holes in a self-aligning manner with the gate structures, the self-aligned contact holes exposing both the first insulation spacers and the active regions of the semiconductor device.

Preferably, the semiconductor device further comprises: a specific circuit having a predetermined function formed on the semiconductor substrate; a redundant circuit formed with the same function as that of the specific circuit on the semiconductor substrate; and a fuse formed with the same structure as that of the gate structures on the first insulation layer, the fuse being melted and removed for replacing a defective circuit with the redundant circuit.

Preferably, the semiconductor device further comprises: a planarized first interlayer dielectric (ILD) film pattern formed on the second insulation layer, bit lines formed on the first ILD film pattern; and a third insulation layer formed to cover the top surface of the bit lines, wherein the bit lines comprise conductive patterns and the upper edges of the conductive patterns are chamfered.

The semiconductor device may further comprise second insulation spacers on the sidewalls of the bit lines and on the sidewalls of the third insulation layer.

Preferably, the semiconductor device further comprises: a second ILD film pattern on the third insulation layer; and contact plugs filling self-aligned contact holes in a self-aligning manner with the bit lines, the self-aligned contact holes exposing both the second insulation spacers and an active region of the semiconductor device.

Preferably, the semiconductor device further comprises: a second ILD film pattern on the third insulation layer; and contact plugs filling self-aligned contact holes in a self-aligning manner with the gate structures and the bit lines, the self-aligned contact holes exposing both the first and second insulation spacers and an active region of the semiconductor device.

In another embodiment, the present invention provides a semiconductor device comprising: an ILD film pattern formed on a semiconductor substrate; bit lines formed on the ILD film pattern, the bit lines comprising conductive patterns and the upper edges of the conductive patterns being chamfered; and an insulation layer formed with a first width W on the bit lines, wherein the sidewalls of the insulation layer overhang the upper edges of the bit lines.

In another aspect of the object, the present invention provides a method of manufacturing a semiconductor device, comprising forming a first conductive layer on a semiconductor substrate. A second conductive layer, is formed on the first conductive layer, and first mask patterns are formed on the second conductive layer, the first mask patterns partially exposing the top surface of the second conductive layer. Then, part of the second conductive layer is isotropically etched using the first mask patterns as an etch mask, so as to form first undercut regions exposing the edges of the bottom of the first mask patterns. Then, the remaining second conductive layer is anisotropically etched using the first mask patterns as an etch mask, so as to form second conductive layer patterns which have lower edges substantially perpendicular to the major surface of the semiconductor substrate, and chamfered upper edges. The first conductive layer is isotropically etched using the first mask pattern as an etching mask, so as to form first conductive layer patterns.

Preferably, forming the first undercut regions are carried out by a dry or wet etching technique. When the dry etching is adopted to form the first undercut regions, at least one gas selected from the group consisting of $CF_4$, $C_2F_6$, $CHF_3$, $CO$, $Ar$, $O_2$, $N_2$ and $He-O_2$ may be used. When the wet etching is adopted to form the undercut regions, a $NH_4OH$, $H_2O_2$ and $H_2O$ mixture may be used.

Preferably, forming the first mask patterns comprises: forming an insulation layer on the second conductive layer; forming photoresist pattens on the insulation layer; and anisotropically etching the insulation layer using the photoresist patterns as an etch mask, so as to form the first mask patterns.

Preferably, forming the first mask patterns is followed by removing the photoresist patterns via ashing, and the formation of the first undercut regions is simultaneously carried out with the ashing of the photoresist patterns. Alternatively, the formation of the first undercut regions may be continuously carried out immediately after the ashing of the photoresist patterns in the same chamber.

Preferably, after forming the first mask patterns, the method of manufacturing the semiconductor device further comprises: removing the photoresist patterns via ashing; and removing residue which results from the ashing, via a stripping process, and forming the first undercut regions is continuously carried out immediately after the stripping process in the same chamber.

Preferably, the semiconductor device manufacture may further comprise forming an insulation layer on at least the sidewalls of the first and second conductive layer patterns and the first mask patterns. A planarized ILD film is then formed on the insulation layer, and the first ILD film is selectively etched so as to form self-aligned contact holes exposing an active region of the semiconductor substrate.

Preferably, forming the first conductive layer patterns is followed by removing the second conductive layer patterns by a predetermined width from the exposed edges thereof so as to form recessed second conductive layer patterns which have a maximum width less than the width of the first mask patterns and the first conductive layer patterns.

Preferably, the semiconductor device manufacture further comprises forming an insulation layer on at least the sidewalls of the first conductive layer pattern, on the sidewalls of the recessed second conductive layer patterns and on the sidewalls of the first mask patterns. Then, a planarized ILD film is formed on the insulation layer, and the first ILD film is selectively etched so as to form self-aligned contact holes exposing an active region of the semiconductor substrate.

Preferably, the semiconductor device manufacture further comprises forming a first interlayer dielectric (ILD) film which completely covers the first mask patterns. Bit lines are formed on the first ILD film. For the formation of the bit lines, a third conductive layer is formed on the first ILD film, and second mask patterns are formed on the third conductive layer, the second mask patterns exposing part of the top surface of the third conductive layer. Then, part of the exposed third conductive layer is isotropically etched using the second mask patterns as an etch mask so as to form second undercut regions exposing the edges of the bottom of the second mask patterns. Then, the remaining part of the exposed third conductive layer is anisotropically etched using the second mask patterns as an etch mask so as to form third conductive layer patterns which have lower edges substantially perpendicular to the major surface of the semiconductor substrate, and chamfered upper edges.

The semiconductor device manufacture may further comprises forming first insulation spacers on the sidewalls of the first and second conductive layer patterns and the first mask patterns. Then, second insulation spacers are formed on the sidewalls of the third conductive layer patterns and the second mask patterns. Preferably, the semiconductor device manufacture further comprises forming a second ILD film to cover the second mask patterns. The second and first ILD films are selectively etched so as to form self-aligned contact holes exposing the first and second insulation spacers and active region of the semiconductor substrate. Then, the self-aligned contact holes are filled with a conductive material so as to form contact plugs in a self-aligning manner with the first and second conductive patterns and the bit lines.

According to the present invention, a desired insulation length can be ensured without the degradation of the electrical properties of devices, by the insulation spacers with a sufficient width between the gate structures and the contact plugs self-aligned therewith. Thus, the present invention can be adapted to the manufacture of highly integrated semiconductor devices having a design rule of 0.25 μm or less.

Also, when the contact plugs are self-aligned with both the gate structures and the bit lines, the present invention can provide the bit lines with the chamfered upper edges, so that the spacers on the sidewalls of the bit lines can provide a sufficient width after etching to form self-aligned contact holes, and thus a desired insulation length between the bit lines and the contact plugs can be ensured without adverse effects on the electrical properties of devices.

In addition, in the method for manufacturing the semiconductor device according to the present invention, the metal silicide layer patterns with the chamfered upper edges can be formed without additional complicated processing. That is, the chamfered upper edges of the metal silicide layer patterns are formed during the process for ashing and stripping the photoresist patterns, which are basic processes included in general semiconductor device fabrication processes so as to remove the photoresist patterns used to pattern the metal silicide layers. Thus, by effectively using the essential processes in semiconductor device manufacture, undercut regions can be formed through a minimum number of processes, which allows the metal silicide layer patterns to have the chamfered upper edges.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
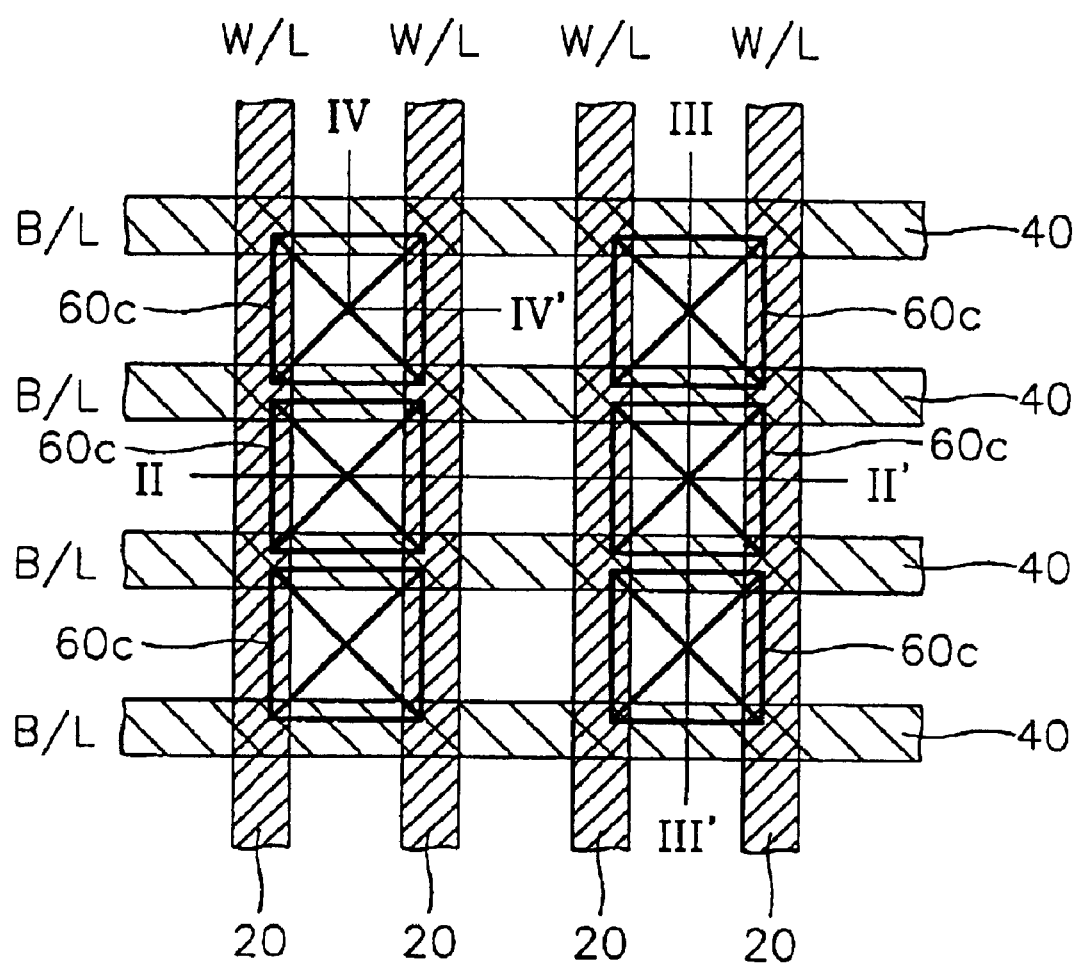
FIG. 1 shows the layout of part of a dynamic random access memory (DRAM) cell in accordance with a preferred embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. In the drawings, like reference numerals are used to refer to like elements throughout.

Referring to FIG. 1, which is the layout of part of a semiconductor device according to the present invention, for illustrating the application of the present invention to a dynamic random access memory (DRAM) cell, a plurality of parallel gate structures 20, each of which forms a word line W/L, extend in a predetermined direction, and a plurality of parallel bit lines 40 extend in the direction perpendicular to the gate structures. Also, a plurality of self-aligned contacts 60c are self-aligned with the gate structures 20 and the bit lines 40.

For example, in a capacitor over bit line (COB) structure, the self-aligned contacts 60c may form contact plugs for electrically connecting capacitors to the active regions of a semiconductor substrate, or contact plugs connected to intermediate pads formed over the bit lines 40.

In forming contact holes for the self-aligned contacts 60c, when the contact holes are formed through a single etching process so as to simultaneously self-align to the bit lines 40 and the gate structures 20, etch stop layers covering the bit lines 40 as well as etch stop layers covering the gate structures 20, such as spacers covering the same, are exposed to etching stress, so that it is difficult to obtain a desirable insulation length between the self-aligned contacts 60c, and the gate structures 20 or bit lines 40.

However, even in such a case, the semiconductor devices according to the present invention can ensure a sufficient insulation length between the gate structures 20 or the bit lines 40, and the self-aligned contacts 60c.

Figure 2:
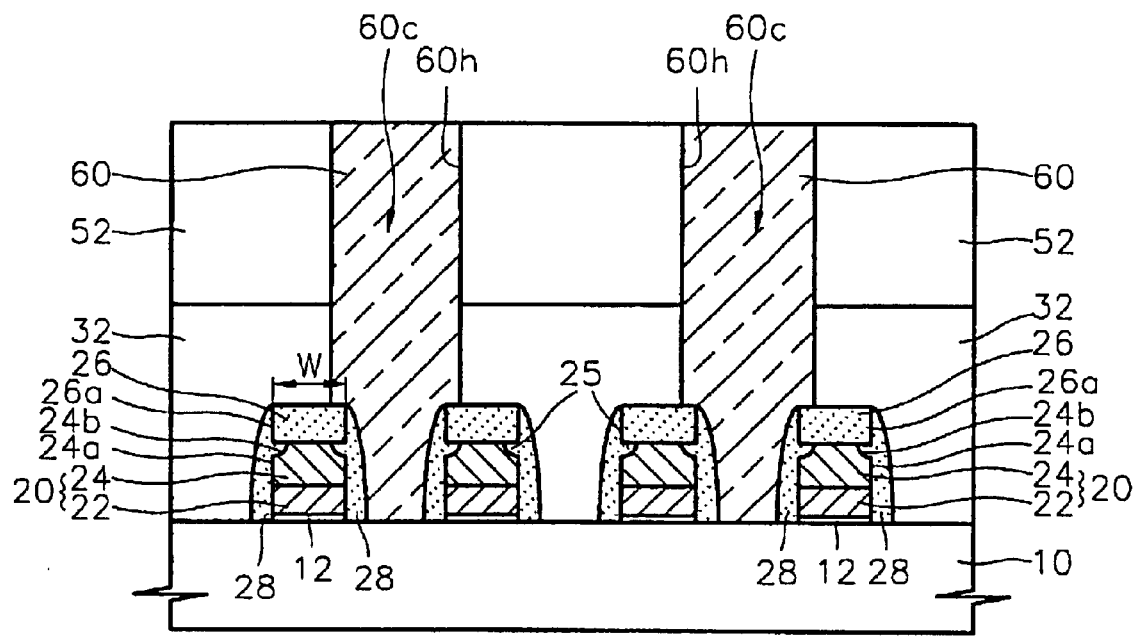
FIG. 2 is a sectional view taken along line II–II' of FIG. 1.

FIG. 2 is a sectional view taken along line II–II' of FIG. 1. Referring to FIG. 2, the gate structures 20 are formed on gate oxide layers 12 on a semiconductor substrate 10. The gate structures 20 have a polycide structure in which polysilicon layer patterns 22 and metal silicide layer patterns 24 are sequentially stacked. The metal silicide layer patterns 24 have lower edges 24a, which are substantially perpendicular to the major surface of the semiconductor substrate 10, and chamfered upper edges 24b.

Also, the top surfaces of the gate structures 20 are capped with insulation masks 26 having a predetermined width W. The insulation masks 26 have sidewalls 26a, which overhang the upper edges 24b of the metal silicide layer patterns 24. Accordingly, due to the chamfered upper edges 24b of the metal silicide layer pattern 24, undercut regions 25 are formed below the overhanging portion of the insulation masks 26.

First insulation spacers 28 are formed on the sidewalls of the gate structures 20 and insulation masks 26. Also, the self-aligned contacts 60c are formed of contact plugs 60, for example, polysilicon plugs, which fill the contact holes 60h which pass through first interlayer dielectric (ILD) film pattern 32 and second ILD film pattern 52.

Since the upper edges 24b of the metal suicide layer pattern 24 are chamfered, the first insulation spacers 28 have a sufficient width between the gate structures 20, and in particular, the upper edges 24b thereof, and the contact plugs 60. Thus, a sufficient insulation length can be ensured between the gate structures 20 and the contact plugs 60.

Figure 3A:
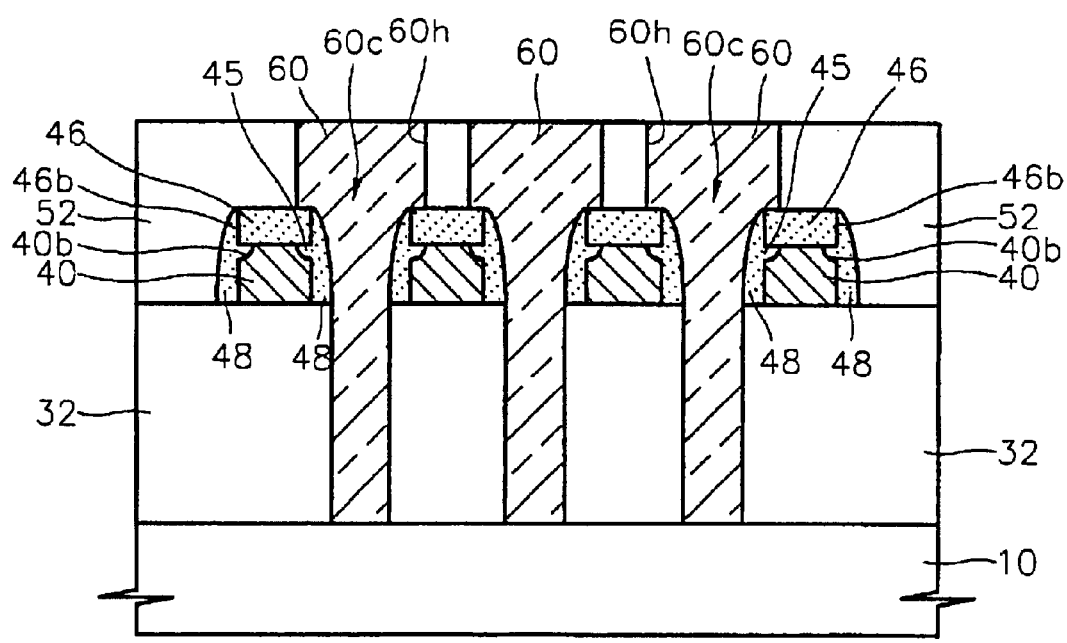
FIG. 3A is a sectional view taken along line III–III' of FIG. 1.

FIG. 3A is a sectional view taken along line III–III' of FIG. 1. Referring to FIG. 3A, the bit lines 40 formed of a metal such as aluminum (Al) or tungsten (W) are formed on the first ILD film pattern 32. The bit lines 40 have chamfered upper edges 40b.

The top surfaces of the bit lines 40 are capped with insulation masks 46. The insulation masks 46 have sidewalls 46b, which overhang the upper edges 40b of the bit lines 40. Accordingly, due to the chamfering of the upper edges 40b of the bit lines 40, undercut regions 45 are formed below the overhanging portions of the insulation masks 46.

Second insulation spacers 48 are formed on the sidewalls of the bit lines 40 and insulation masks 46. Since the upper edges 40b of the bit lines 40 are chamfered, the second insulation spacers 48 have a sufficient width between the bit lines 40 and the contact plugs 60. Thus, a sufficient insulation length can be ensured between the bit lines 40 and the contact plugs 60. The structure of the bit lines 40 shown in FIG. 3A, which are formed of single layered metal patterns, is illustrative but should not be taken as limiting.

Figure 3B:
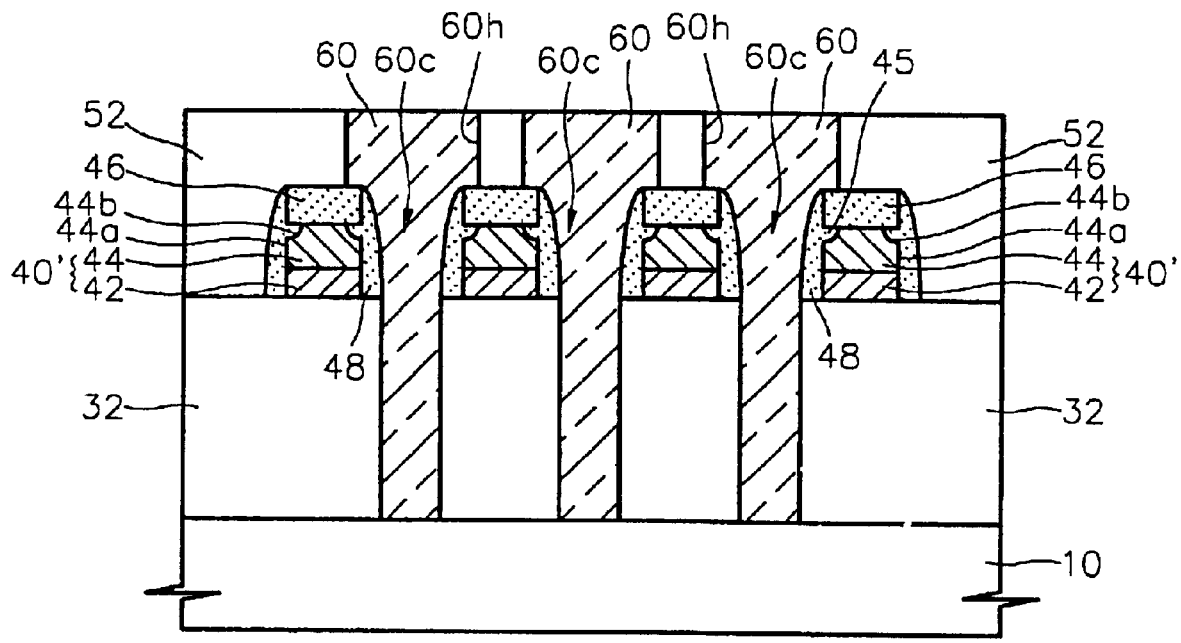
FIG. 3B shows a modification of the structure of FIG. 3A.

FIG. 3B shows a modification of the bit line structure of FIG. 3A, which corresponds to the cross-section taken along line III–III' of FIG. 1. Referring to FIG. 3B, bit lines 40' have the same structure as that of the bit lines 40 of FIG. 3A, except that the bit lines 40' have a polycide structure, as do the gate structures 20, in which a polysilicon silicon layer pattern 42 and a metal silicide layer pattern 44 are sequentially stacked.

Figure 4A:
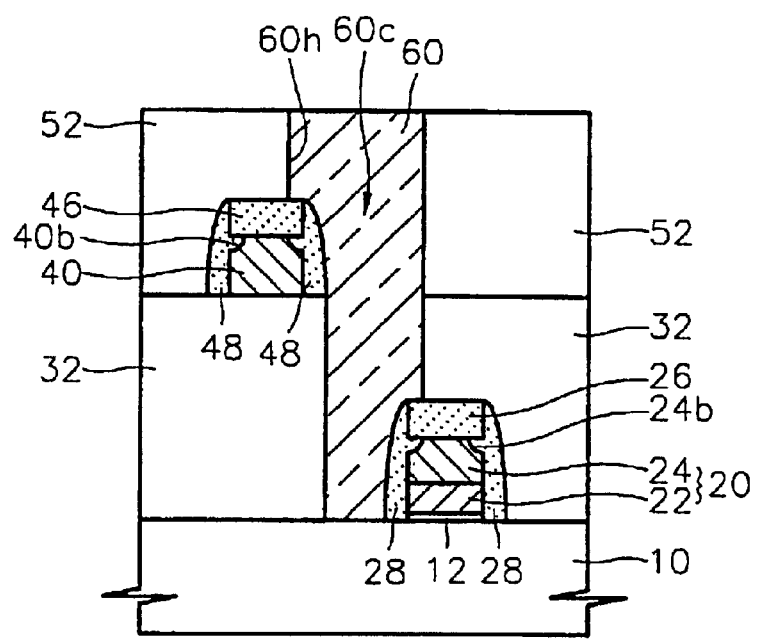
FIG. 4A is a sectional view taken along line IV–IV' of FIG. 1.

FIG. 4A is a sectional view taken along line IV–IV' of FIG. 1. The contact plugs 60 are self-aligned with the gate structures 20 and the bit lines 40. The bit lines 40 with a single layered metal pattern structure have the chamfered upper edges 40b, and the metal suicide layer patterns 24 of the gate structures 20 also have the chamfered upper edges 24b. Thus, even though the first and second insulation spacers 28 and 48 are exposed to excessive etching stress in a single etching process for forming the contact holes 60h that expose both the first and second insulation spacers 28 and 48, the first and second insulation spacers 28 and 48 have the widths which are wide enough to ensure a desired insulation length between the gate structures 20 and the contact plugs 60, and between the bit lines 40 and the contact plugs 60, respectively.

Figure 4B:
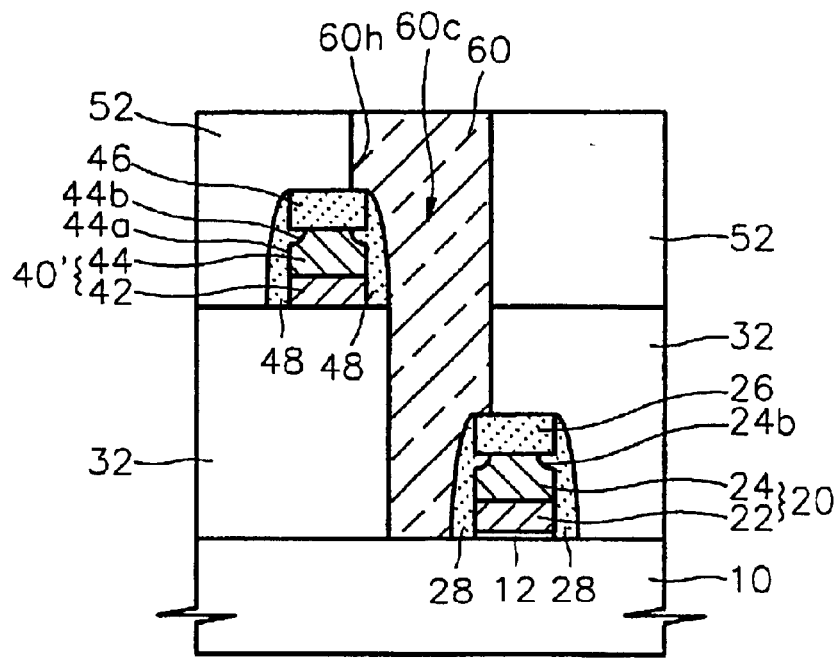
FIG. 4B shows a modification of the structure of FIG. 4A.

FIG. 4B shows a modification of the bit line structure shown in FIG. 4A, which corresponds to the cross-section taken along line IV–IV' of FIG. 1. Referring to FIG. 4B, the bit lines 40' have the same structure as that of the bit lines 40 of FIG. 4A, except that the bit lines 40' have a polycide structure, as do the gate structures 20, in which the polysilicon silicon layer pattern 42 and the metal silicide layer pattern 44 are sequentially stacked.

Figure 4C:
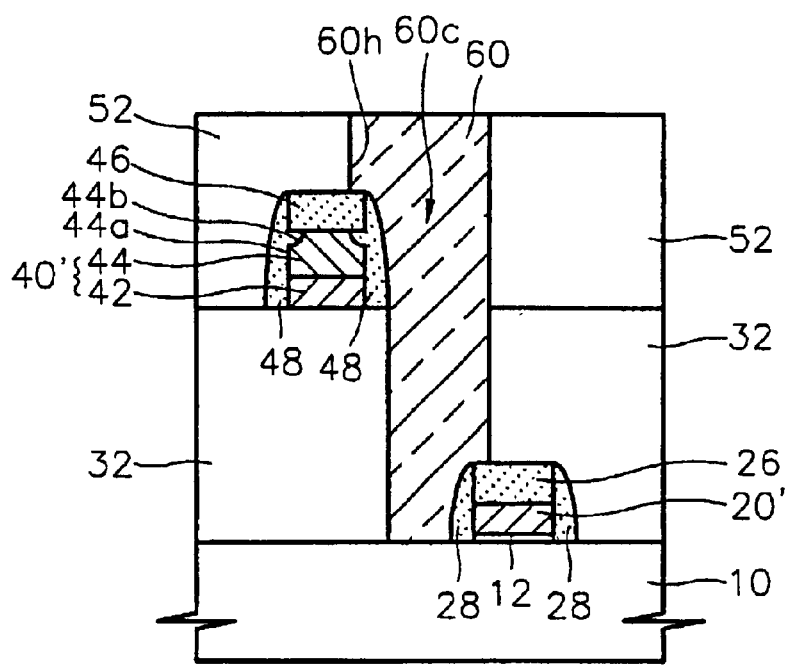
FIG. 4C shows another modification of the structure of FIG. 4A

FIG. 4C shows another modification of the structure shown in FIG. 4A, which corresponds to the cross-section taken along line IV–IV' of FIG. 1. As shown in FIG. 4C, the bit lines 40' have the same structure as that of the bit lines shown in FIG. 3B while gate structures 20' have a general gate structure formed of, for example, a doped polysilicon.

Figure 5:
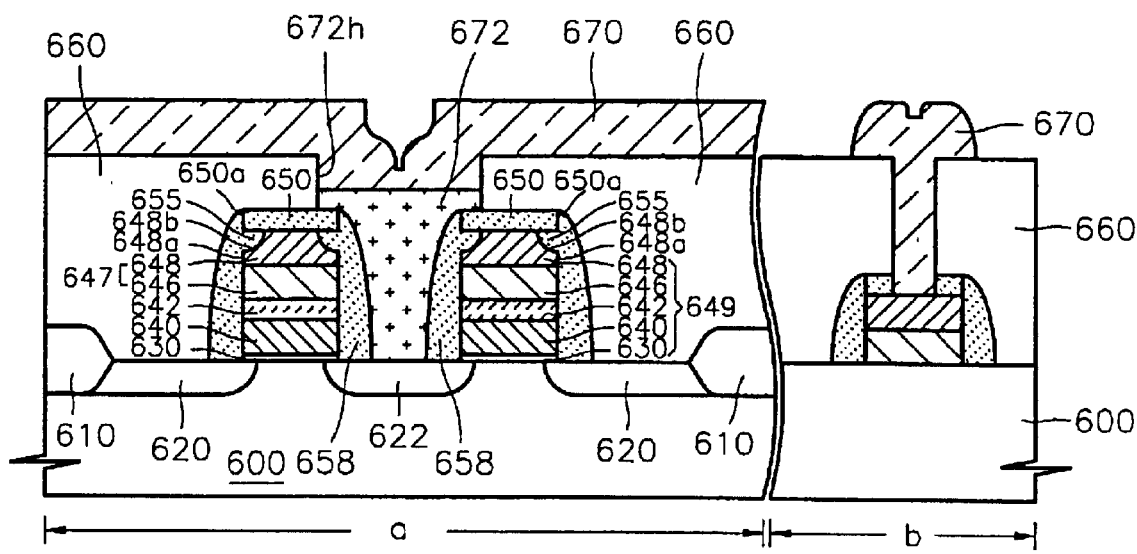
FIG. 5 is a sectional view of part of a flash memory cell in accordance with another embodiment of the present invention.

FIG. 5 is a sectional view showing part of a nonvolatile semiconductor memory device, and particularly, of a flash memory cell, according to another embodiment of the present invention. In FIG. 5, reference character "a" represents a cell region and reference character "b" represents a peripheral circuit region.

Source regions 620 and drain regions 622 are formed in cell array region "a" of a semiconductor substrate 600 having isolation regions 610. Also, in the cell array region "a", tunnel oxide layers 630, floating gates 640, dielectric films 642 and control gates 647 are sequentially stacked, collectively forming gate structures 649.

In the cell array region "a", the control gates 647 have a polycide structure in which polysilicon layer patterns 646 and metal silicide layer patterns 648 are sequentially stacked. The metal silicide layer patterns 648 have lower edges 648a, which are substantially perpendicular to the major surface of the semiconductor substrate 600, and chamfered upper edges 648b.

The top surfaces of the control gates 647 are capped with insulation masks 650. The insulation masks 650 have sidewalls 650a, which overhang the upper edges 648b of the metal silicide layer patterns 648. Accordingly, due to the chamfering of the upper edges 648b of the metal silicide layer patterns 648, undercut regions 655 are formed below the overhanging portions of the insulation masks 650.

Insulation spacers 658 are formed on the sidewalls of the gate structures 649 and the sidewalls 650a of the insulation masks 650. Also, in order to electrically isolate metal interconnection layers 670, which are formed over the semiconductor substrate 600, from the semiconductor substrate 600 on which the gate structures 649, the source regions 620 and the drain regions 622 have been formed, ILD film pattern 660 is interposed therebetween. Contact holes 672h formed through the ILD film pattern 660 are filled with contact plugs 672 self-aligned with the gate structures 649. The drain regions 622 of the cell array region "a" are electrically connected to the metal interconnection layers 670 via the contact plugs 672.

Since the upper edges 648b of the metal silicide layer patterns 648 of the control gates 647 are chamfered, the insulation spacers 658 have a sufficient width between the gate structures 649, in particular, the upper edges 648b thereof, and the contact plugs 672. Thus, a sufficient insulation length can be ensured between the gate structures 649 and the contact plugs 672.

Generally, semiconductor devices such as static random access memories (SRAMs) and dynamic random access memories (DRAMs) incorporate redundant circuits so as to improve a manufacturing yield of the semiconductor devices. These redundant circuits are employed for preventing reduction of the yield of the semiconductor devices, which may be caused by random defects produced during manufacturing processes of the semiconductor devices.

Redundancy is provided with respect to the specific circuit having a predetermined function, so that a few possible defects will not impair the function of the semiconductor device as a whole, owing to the redundant circuit formed to have the same function as the specific circuit. In order to replace the defective specific circuit with the redundant circuit, there is formed a fuse which can be fused, i.e., melted and removed by a laser beam spot.

Figure 6A:
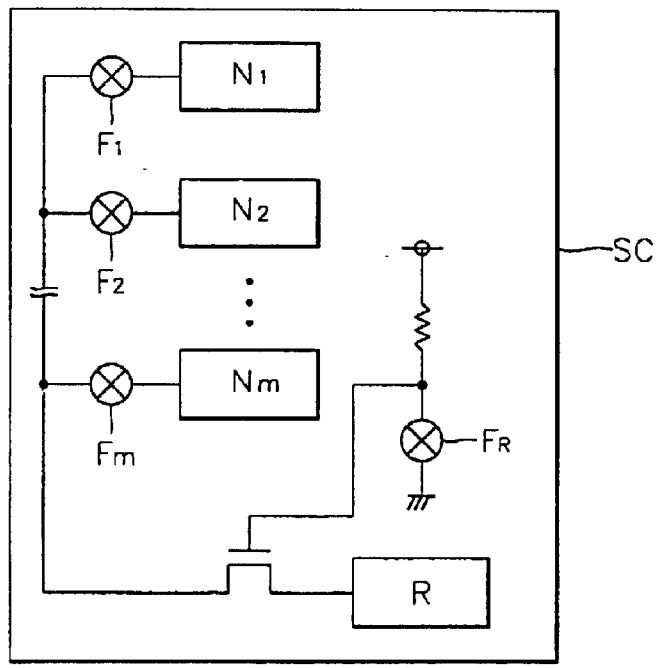
FIG. 6A is a schematic view of the structure of a chip having a redundant circuit.

FIG. 6A shows the structure of one of chips (SCs), each having a redundant circuit, of a semiconductor device. In FIG. 6A, an open loop formation type redundant circuit is shown.

The chip SC includes a number of specific circuits $N_1, N_2, \ldots, N_m$ which have the same function, each including a plurality of memory cells having the same function in the semiconductor device. The circuits $N_1, N_2, \ldots, N_m$ are connected to fuses $F_1, F_2, \ldots, F_m$, respectively, which can be blown to activate the specific circuits $N_1, N_2, \ldots, N_m$. Also, in the chip SC, there is a redundant circuit R having the same function as that of the specific circuits $N_1, N_2, \ldots, N_m$ in order to replace any of the inactivated specific circuits $N_1, N_2, \ldots, N_m$. The fuse $F_R$ can be blown for activating the redundant circuit R.

The fuses $F_1, F_2, \ldots, F_m$ and $F_R$ may be formed with a spare gate structure, which is simultaneously made with the gate structures for the word lines, or with a spare bit line structure, which is simultaneously configured in the bit line formation.

Figure 6B:
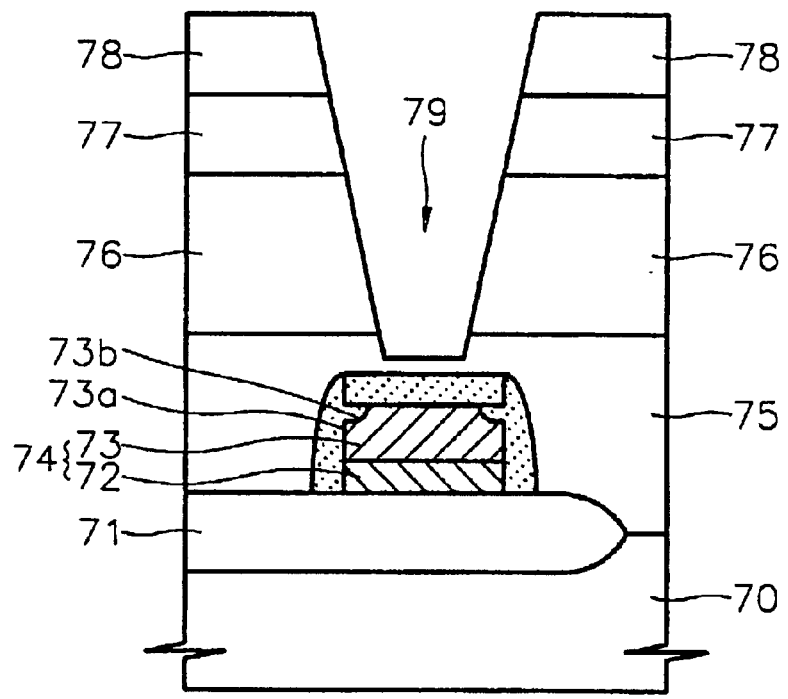
FIG. 6B is a sectional view of a semiconductor device having a fuse in accordance with another embodiment of the present invention.

FIG. 6B is a sectional view of a semiconductor device having a fuse according to a preferred embodiment of the present invention, and in particular, of the case where the fuse is simultaneously formed with the spare gate formation as mentioned above. Referring to FIG. 6B, an insulation layer 71, which is an isolation layer for electrically isolating neighboring semiconductor devices from each other, is formed on a part of a semiconductor substrate 70. The insulation layer 71 illustrated in FIG. 6B is formed of a field oxide layer. However, the insulation layer 71 may be formed of an isolation layer formed by a trench isolation technique. The insulation layer 71 has a thickness of about 2,000–8,000 Å.

A fuse 74 is formed on the insulation layer 71. The fuse 74 is formed with a polycide structure in which polysilicon layer patterns 72 and metal silicide layer patterns 73 are sequentially stacked. The metal silicide layer patterns 73 have lower edges 73a, which are substantially perpendicular to the major surface of the semiconductor substrate 70, and chamfered upper edges 73b. The insulation layer 71 separates the fuse 74 from adjacent devices, and in particular, from the semiconductor substrate 70. In FIG. 6B, the fuse 74 with the polycide structure is illustrated. However, the fuse 74 may be formed of a single layered metal pattern with chamfered upper edges.

A plurality of ILD films 75, 76, 77 and 78 are sequentially stacked on the fuse 74 and on the insulation layer 71. Also, an opening 79 is formed over the fuse 74, through the plurality of ILD films 75, 76, 77 and 78. In order to activate a redundant circuit having the same function as that of the specific circuit having a predetermined function and to replace a defective specific circuit with the activated redundant circuit, a laser beam can be irradiated through the opening 79 onto the fuse 74, such that the fuse 74 is blown.

Figure 6C:
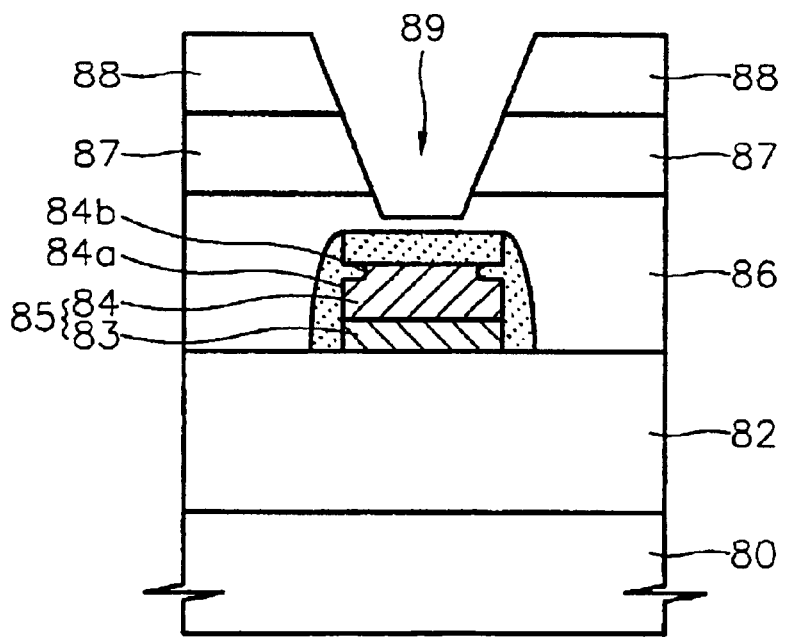
FIG. 6C is a sectional view of a semiconductor device having a fuse in accordance with yet another embodiment of the present invention.

FIG. 6C is a sectional view of a semiconductor device having a fuse according to another embodiment of the present invention, and in particular, in the case where the fuse is simultaneously formed with the spare bit line formation as mentioned above. Referring to FIG. 6C, a first ILD film 82, which is an insulation layer formed on lower structures such as gate structure so as to insulate the lower structures from an upper conductive layer, is formed on a semiconductor substrate 80.

A fuse 85 is formed on the first ILD film 82. The fuse 85 is formed with a polycide structure in which polysilicon layer patterns 83 and metal silicide layer patterns 84 are sequentially stacked. The metal silicide layer patterns 84 have lower edges 84a, which are substantially perpendicular to the major surface of the semiconductor substrate 80, and chamfered upper edges 84b. In FIG. 6C, the fuse 85 with the polycide structure is illustrated. However, the fuse 85 may be formed of a single layered metal pattern with chamfered upper edges.

A plurality of ILD films 86, 87 and 88 are sequentially stacked on the fuse 85 and on the first ILD film 82. Also, an opening 89 is formed over the fuse 85, through the plurality of ILD films 86, 87 and 88. In order to activate a redundant circuit having the same function as that of the specific circuit having a predetermined function and to replace a defective specific circuit with the activated redundant circuit, a laser beam can be irradiated through the opening 89 onto the fuse 85, such that the fuse 85 is blown.

The inventors carried out the following experiments in order to find a method for forming the above-mentioned metal silicide layer having the chamfered upper edges.

Figure 7:
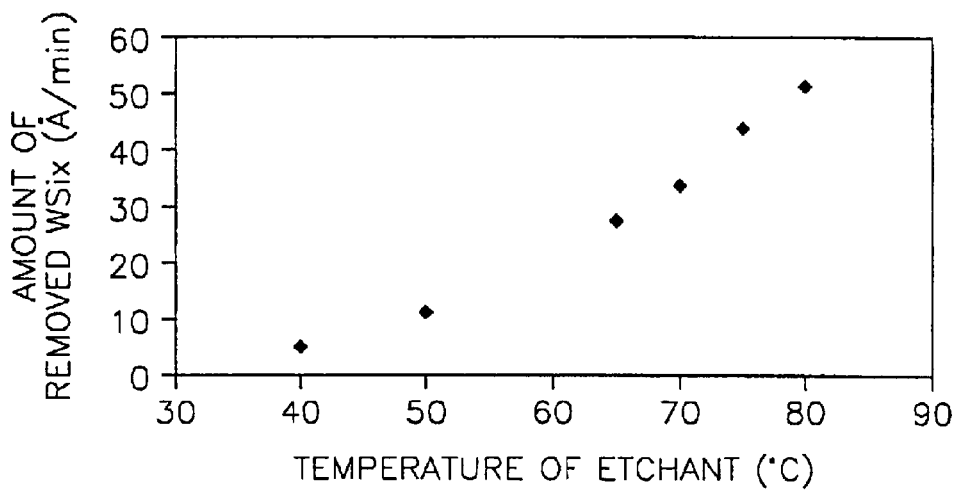
FIG. 7 is a graph showing the amount of removed tungsten silicide by etching with respect to the temperature of an etchant.

FIG. 7 illustrates a variation of the amount of removed tungsten silicide by etching with respect to the temperature of an etchant when a tungsten silicide ($WSi_x$) layer is formed on a silicon wafer and then exposed to isotropic etching in an etchant. Here, a mixture of $NH_4OH$, $H_2O_2$ and $H_2O$ (hereinafter, simply referred to as a "SC1" solution) was used as the etchant. The SC1 solution was prepared to contain $NH_4OH$ of 1.7% and $H_2O_2$ of 4.1%, by weight based on the total weight thereof.

The amount of the removed tungsten silicide was measured by varying the temperature of the SC1 solution in the range of 30 to 90° C. As a result, as shown in FIG. 7, the amount of the removed tungsten silicide almost linearly increases when the temperature of the SC1 solution increases from 40 to 80° C. From the result, it can be concluded that the amount of tungsten silicide removed by etching, can be controlled by varying the temperature of the SC1 solution in the above mentioned range.

Figure 8A:
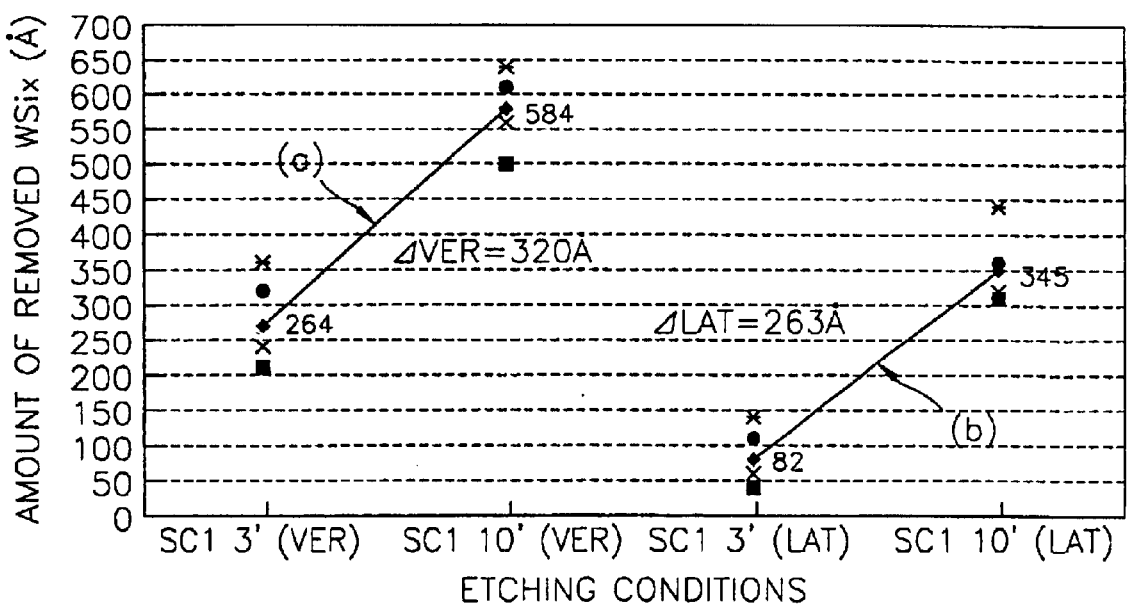
FIG. 8A is a graph comparatively showing the amount of removed tungsten silicide by etching in the vertical and horizontal directions using SC1 solution, with respect to etching time.

FIG. 8A illustrates the comparison of the amount of vertical etching (indicated by (a)) and lateral etching (indicated by (b)), of a tungsten silicide layer formed on a silicon wafer when the tungsten silicide layer is etched in the SC1 solution. In order to get a sample for this experiment, a polysilicon layer and a tungsten silicide layer were sequentially deposited on the silicon wafer, and then a nitride layer pattern capping part of the top surface of the tungsten silicide layer, was formed on the tungsten silicide layer.

The SC1 solution was prepared to contain $NH_4OH$ of 1.7% and $H_2O_2$ of 4.6%, by weight based on the total weight thereof. A plurality of samples each having the above structure were prepared, and then classified into a first group and a second group for isotropic etching for 3 and 10 minutes, respectively. Isotropic etching was carried out on the samples of the first and second groups for 3 (indicated by SC1 3') and 10 (indicated by SC1 10') minutes, respectively, using the SC1 solution, which was maintained at 70° C., to etch the tungsten silicide layer which was exposed through the nitride layer patterns. Then, the amount of etching of the tungsten silicide layer in undercut regions formed below the overhanging portions of the nitride layer pattern, in the vertical (VER) and lateral (LAT) directions was measured for each sample group.

As a result, the average amount of etching of the tungsten silicide layer in the vertical direction was 264 Å for the samples SC1 3' and 584 Å for the samples SC1 10'. Also, the average amount of etching in the lateral direction was 82 Å for the samples SC1 3' and 345 Å for the samples SC1 10'. The difference in the average amount of etching of the tungsten silicide layer between the samples SC1 3' and SC110' was 320 Å in the vertical direction (ΔVER) and 263 Å in the lateral direction (ΔLAT).

On the basis of the result shown in FIG. 8A, a desired amount of etching in the vertical and lateral directions, of the portion of the tungsten silicide layer, near the lower edges of the nitride layer patterns partially capping the tungsten silicide layer, can be selected, and etching time can be determined according to the selected amount of etching of the tungsten silicide layer.

Ideally, the tungsten silicide layer in the undercut regions formed below the overhanging portions of the nitride layer pattern is etched in the vertical and lateral directions in a ratio of 1:1. Also, etching conditions which satisfy these etching requirements may be determined to be the optimal etching conditions.

Figure 8B:
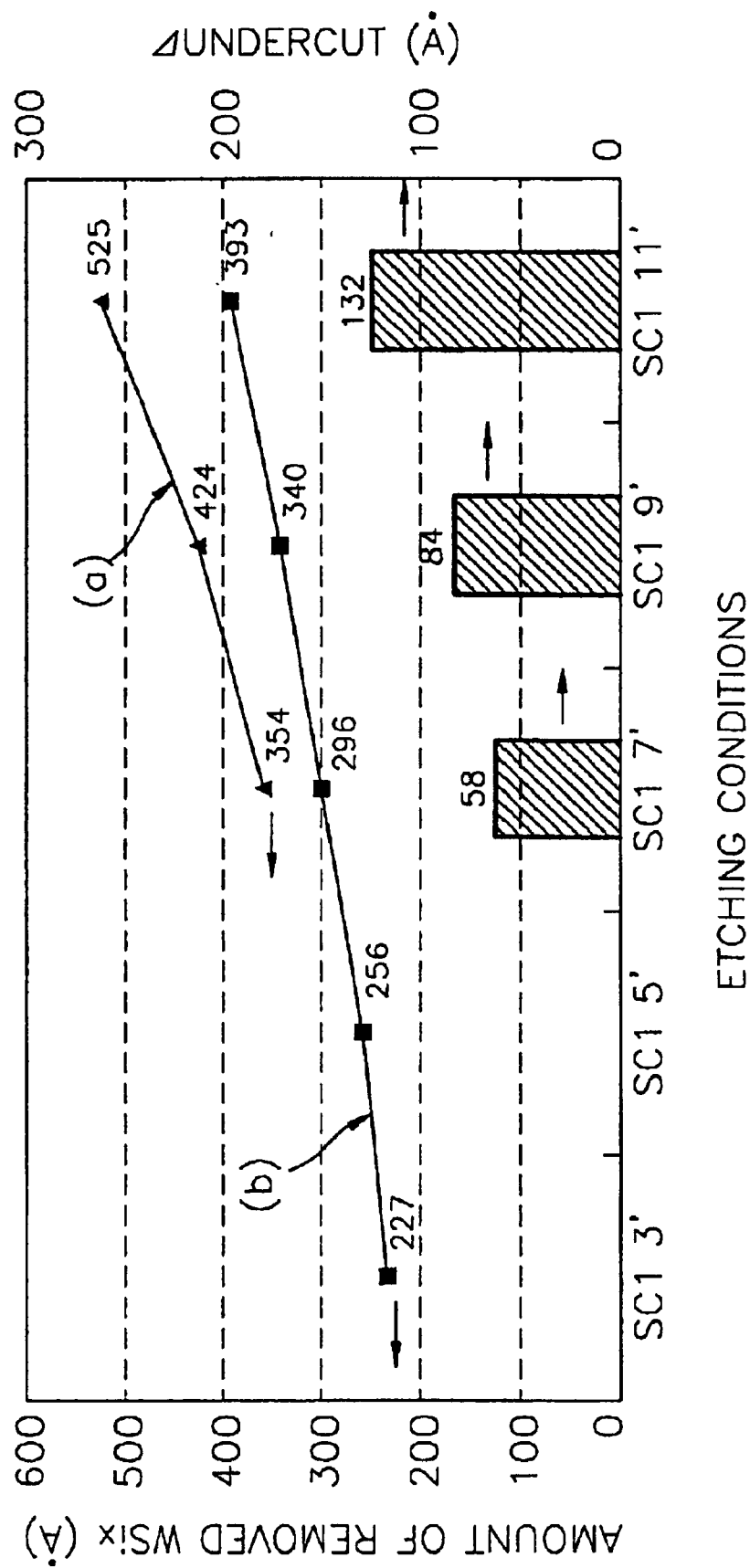
FIG. 8B is a graph for use in determining the optimal etching time for etching a tungsten silicide layer using SC1 solution.

FIG. 8B shows the result of an experiment for determining an optimal etching time for a desired result when a tungsten silicide layer is exposed to isotropic etching using the SC1 solution. Samples and the etchant for this experiment were prepared in the same manner as in the experiment described with reference to FIG. 8A. In the present experiment, the tungsten silicide layer, which is partially exposed through the nitride layer pattern, was etched using the SC1 solution, which was maintained at 70° C., for 3, 5, 7, 9 and 11 minutes, and the amount of etching of the tungsten silicide layer in the undercut regions below the overhanging portions of the nitride layer pattern was measured in the vertical and lateral directions.

As shown in FIG. 8B, with a variation of the etching time in the range of 7 to 11 minutes, the amount of etching in the vertical direction (indicated by (a)) of the tungsten silicide layer, varied from 354 to 525 Å. Also, as the etching time was varied from 3 to 11 minutes, the amount of etching in the lateral direction (indicated by (b)) of the tungsten silicide layer varied from 227 to 393 Å.

In particular, in the range of 7 to 11 minutes, the difference in the amount of etching of the tungsten silicide layer in the undercut regions (ΔUNDERCUT), between the vertical and lateral directions, was 58 Å for the samples SC1 7' (etched for 7 minutes), 84 Å for the samples SC1 9' (etched for 9 minutes), and 132 Å for the samples SC1 11' (etched for 11 minutes). In the samples SC1 7', an almost ideal vertical etching to lateral etching ratio of the tungsten silicide layer, which is near the ideal etching ratio of 1:1, was shown, relative to the other samples.

Figure 9A:
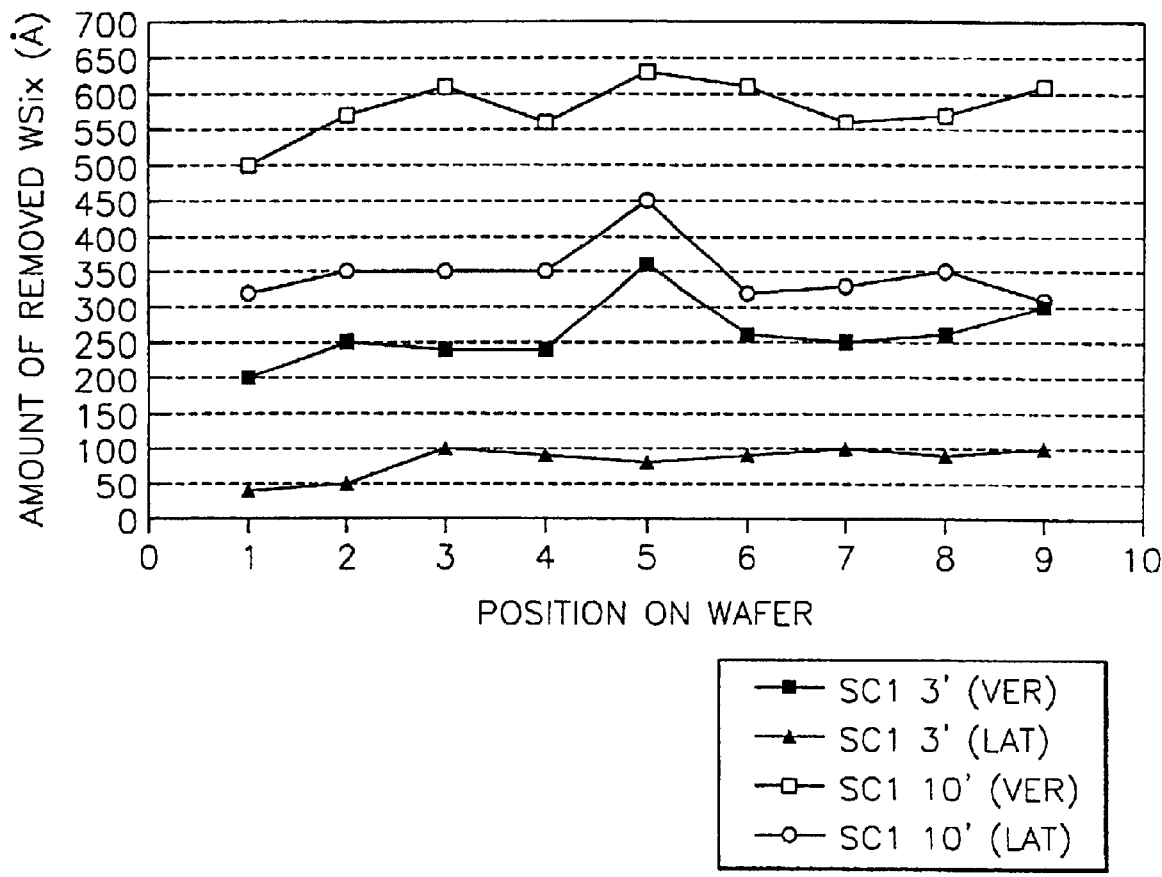
FIG. 9A is a graph illustrating the etching uniformity of the tungsten silicide layer with the SC1 solution.
Figure 9B:
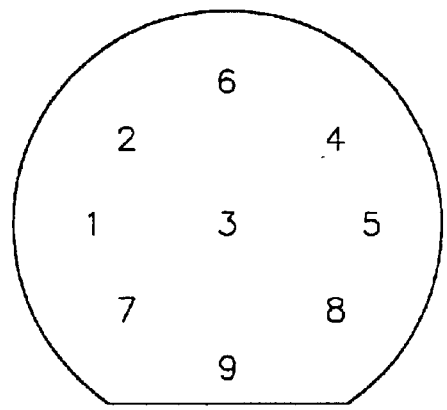
FIG. 9B shows the positions on the wafer at which the etching uniformity of FIG. 9B were measured.

FIG. 9A shows the etching uniformity of the tungsten silicide layer through the entire surface of a wafer when a tungsten silicide layer is isotopically etched using the SC1 solution. Samples and the etchant for this experiment were prepared in the same manner as in the experiment described with reference to FIG. 7. In the present experiment, the tungsten suicide layer in the undercut regions below the overhanging portions of the nitride layer pattern was etched using the SC1 solution, which was maintained at 70° C., for 3 minutes (SC1 3') and 10 minutes (SC1 10'), respectively, and the amount of etching of the tungsten silicide layer was measured for the samples SC1 3' and SC1 10' in both the vertical (VER) and lateral (LAT) directions, at various positions on the wafer. The positions in the wafer, where the amount of etching of the tungsten silicide layer was measured, are illustrated in FIG. 9B.

The result of FIG. 9A exhibits that the etching uniformity in both the vertical and lateral directions are maintained at each position of the wafer, without deterioration, irrespective of the duration of the etching with the SC1 solution.

Hereinafter, a method of manufacturing a semiconductor device having a chamfered metal silicide layer, on the basis of the experiment result described above, according to the present invention will be described in greater detail.

In the following embodiments, for convenience of explanation, a configuration of adopting a chamfered metal silicide layer in forming gate structures on a semiconductor structure will be described. The gate structures having the chamfered metal silicide layer are illustrative but should not be taken as limiting. Although the preferred embodiments are described with reference to the gate structure formation, it is appreciated that the spirit of the present invention can be readily adapted in manufacturing bit lines or other devices such as fuses.

FIGS. 10A through 10J are sectional views sequentially illustrating the fabrication of a semiconductor device according to a first preferred embodiment of the present invention.

Figure 10A:
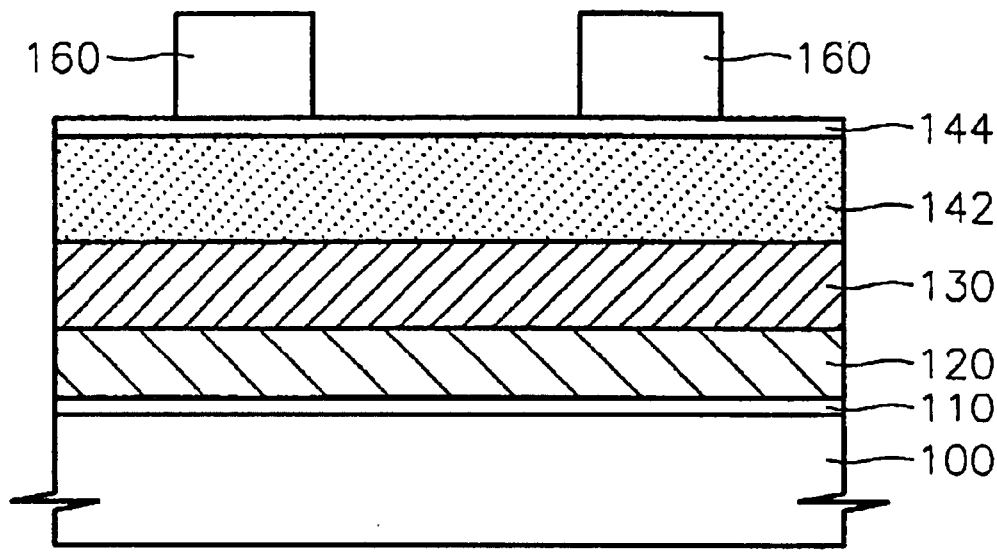
FIGS. 10A through 10J depict the cross-section of a semiconductor device manufactured in accordance with a first preferred embodiment of the present invention.

In particular, referring to FIG. 10A, a gate oxide layer 110 is formed on a semiconductor substrate 100, a polysilicon layer 120 doped with impurities and a metal silicide layer 130 are sequentially stacked on the gate oxide layer 110. The metal silicide layer 130 may be formed of, for example, tungsten silicide ($WSi_x$), titanium silicide ($TiSi_x$), tantalum suicide ($TaSi_x$) or cobalt silicide ($CoSi_x$). Then, a silicon nitride layer 142 and a high-temperature oxide (HTO) layer are sequentially deposited on the metal silicide layer 130. The formation of the HTO layer 144 may be omitted in some cases. Then, photoresist pattens 160 are formed on the HTO layer 144.

Figure 10B:
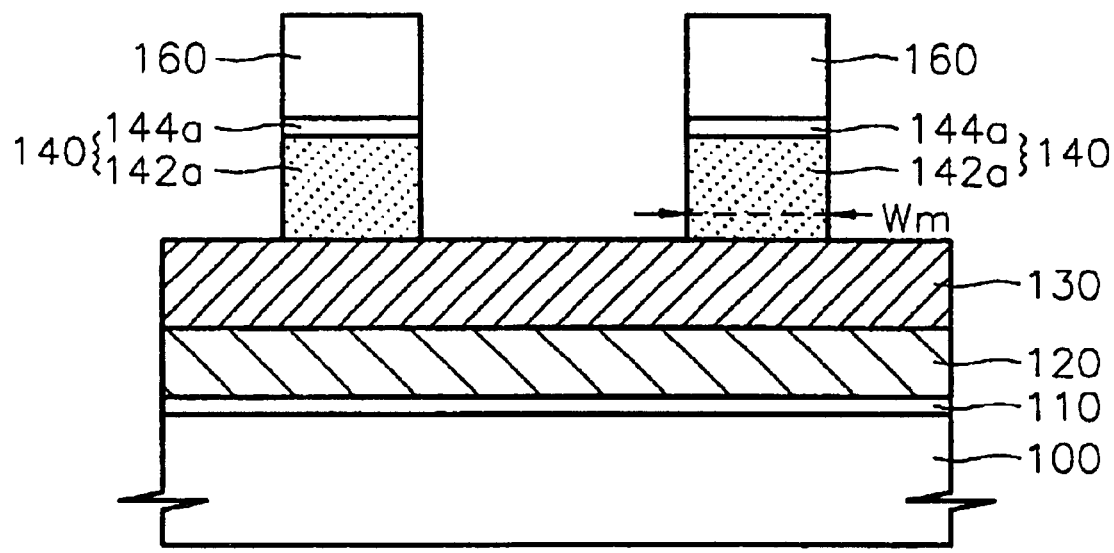

Referring to FIG. 10B, the HTO layer 144 and the silicon nitride layer 142 are exposed to anisotropic etching using the photoresist pattern 160 as an etch mask, to form mask patterns 140, which are formed of silicon nitride layer patterns 142*a* and HTO layer patterns 144*a*. The mask patterns 140 are formed with a predetermined width Wm to cover a part of the metal silicide layer 130, so that the top surface of the metal silicide layer 130 is partially exposed by the mask patterns 140.

Figure 10C:
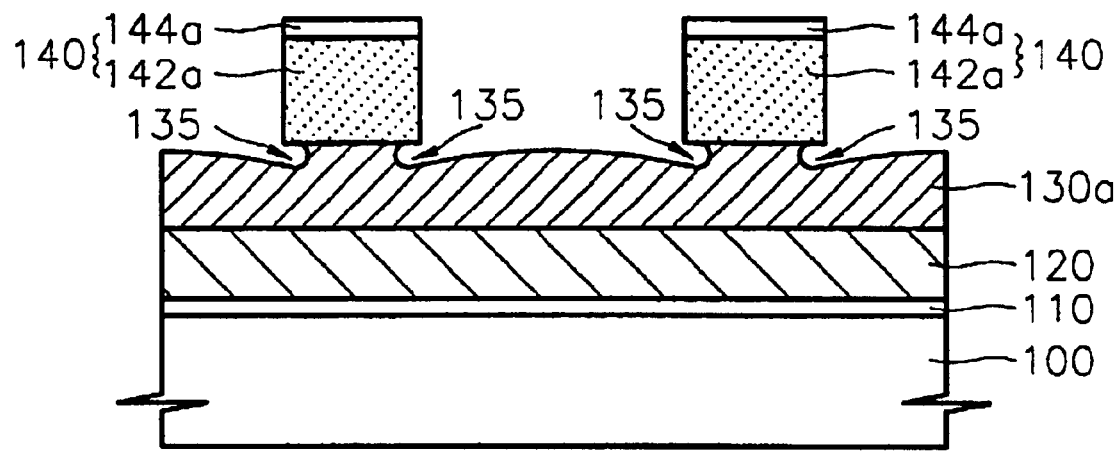

Referring to FIG. 10C, the photoresist patterns 160 are removed via an ashing process with $O_2$ plasma. A $N_2$, He or He—$O_2$ gas may be added during the ashing process if required. Then, a part of the expose metal silicide layer 130 is exposed to isotropic dry etching using the mask patterns 140 as an etch mask, to form undercut regions 135 underneath the mask patterns 140, which expose the edges of the bottom of the mask patterns 140. Accordingly, a metal silicide layer 130a with shallow grooves on the top surface thereof, corresponding to the contours of the undercut regions 135, is formed.

For the isotropic dry etching of the metal silicide layer 130, a plasma etching technique can be used with at least one gas of $CF_4$, $C_2F_6$, $CHF_3$, CO, Ar, $O_2$, $N_2$ and He—$O_2$ gas. Here, a transformer coupled plasma (TCP) source type apparatus and a decoupled plasma source (DPS) type apparatus or the like can be used as an etching apparatus.

For the etching of the metal suicide layer 130, for example, when a gas mixture of $CF_4$ and $O_2$ is used as an etching gas, the $CF_4$ gas is supplied at a flow rate of 5–50 sccm and the $O_2$ gas is supplied at a flow rate of 50–500 sccm, preferably, within a flow ratio between the $CF_4$ and $O_2$ gases of about 1:10. Preferably, the temperature of a wafer stage, which is placed in a plasma etching chamber, is maintained to be within 100–400° C., and the processing pressure is maintained to be within 0.5–3 Torr.

In the isotropic dry etching process for forming the undercut regions 135, preferably, etching conditions are set such that the ratio of the amount of etching of the metal silicide layer 130 in the lateral direction to that in the vertical direction is greater than 1 (i.e., LAT>VET).

The formation of the undercut regions 135 may be simultaneously carried out with the ashing of the photoresist patterns 160. Alternatively, the formation of the undercut regions 135 can be continuously carried out in the same chamber immediately after the ashing of the photoresist patterns 160.

Figure 10D:
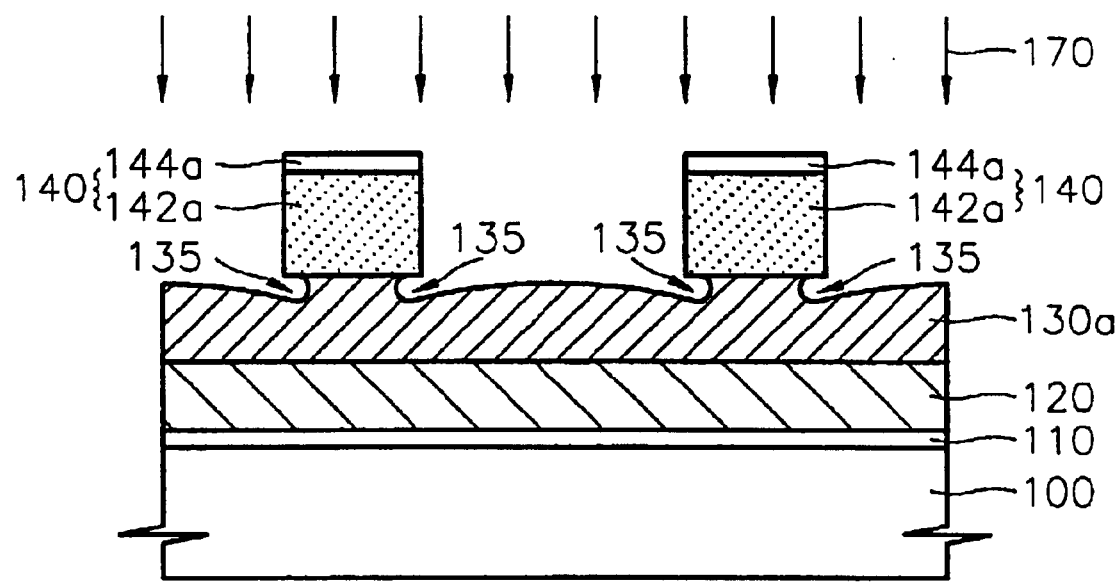

Referring to FIG. 10D, a stripping process is carried out using a predetermined stripping solution 170 so as to remove residues which result from the ashing of the photoresist patterns 160. For example, the residues may include contaminants on the wafer surface, such as photoresist residues, or organic substances which are produced via an etching reaction. During the stripping process, a $H_2SO_4$ solution can be used as the stripping solution 170. Alternatively, a mixture of $NH_4OH$, $H_2O_2$ and $H_2O$ (the SC1 solution) can be used as the stripping solution 170, together with the $H_2SO_4$ solution.

When the $H_2SO_4$ solution and the SC1 solution are simultaneously used, the $H_2SO_4$ solution is contained in a first bath and the SC1 solution is contained in a second bath in a single cleaning system. Then, the stripping process is carried out by passing through the first and second baths in turn. Preferably, the temperature of the SC1 solution is maintained at a temperature of 30–90° C., and more preferably, at about 70° C. Preferably, the SC1 solution contains $NH_4OH$ of about 0.5–3% and $H_2O_2$ of about 2–20%, by weight based on the total weight thereof. More preferably, the SC1 solution contains $NH_4OH$ of about 1.5–2% and $H_2O_2$ of about 3.8–4.5%, by weight based on the total weight thereof.

In the case when the stripping solution 170 contains the SC1 solution, the metal suicide layer 130a that has the shallow grooves is exposed to isotropic wet etching, so that the undercut regions 135 can be enlarged. Thus, in such cases, in the isotropic dry etching of the metal silicide layer 130, which is described with reference to FIG. 10C, the amount of etching of the metal suicide layer 130 in the lateral and vertical directions must be determined taking account into the amount of the metal silicide layer 130 to be further etched in the stripping process.

Figure 10E:
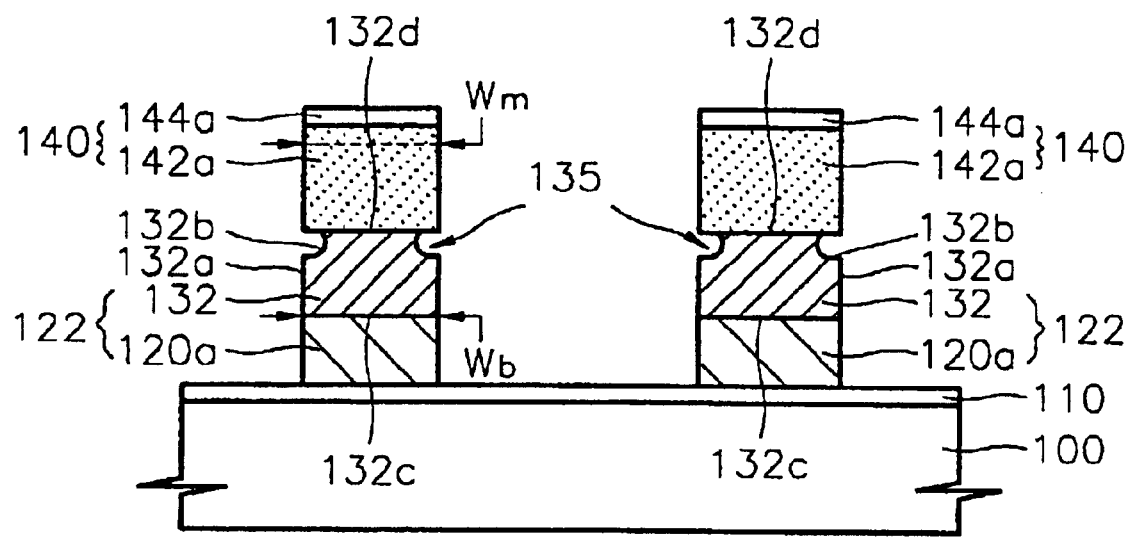

Then, the metal silicide layer 130a with the shallow grooves, and the doped polysilicon layer 120 are exposed to anisotropic dry etching using the mask patterns 140 as an etch mask, thus forming, as shown in FIG. 10E, first gate structures 122 which are comprised of doped polysilicon layer patterns 120a and metal silicide layer patterns 132.

The metal silicide layer patterns 132 have lower edges 132a, which are substantially perpendicular to the major surface of the semiconductor substrate 100, and upper edges 132b which are chamfered due to the undercut regions 135. Also, the metal silicide layer patterns 132 have bottom surfaces 132c with a width Wb, which is substantially equal to the width Wm of the mask pattern 140, and top surfaces 132d with a width which is less than the width Wm of the mask patterns 140 and greater than half the width Wm. Here, the maximum width of the metal silicide layer pattern 132 is substantially equal to the width of the polysilicon layer pattern 120a.

For the anisotropic dry etching of the metal silicide layer patterns 132 and the doped polysilicon layer patterns 120a, a plasma etching technique can be adopted with a gas mixture containing at least one gas of $SF_6$, $O_2$, $N_2$, HBr and He—$O_2$, and a $Cl_2$ gas. Here, a transformer coupled plasma (TCP) source type apparatus, a decoupled plasma source (DPS) type apparatus or the like can be used as an etching apparatus.

Also, by appropriately controlling the composition of the gas mixture for the plasma etching, the metal silicide patterns 132 and the doped polysilicon layer patterns 120 can be simultaneously or separately formed. For the separate etching process, the metal silicide patterns 132 are first formed using a gas mixture with a commonly used composition, and the doped polysilicon layer patterns 120a are formed using a gas mixture having a composition that is highly selective with respect to the gate oxide layer 110.

Figure 10F:
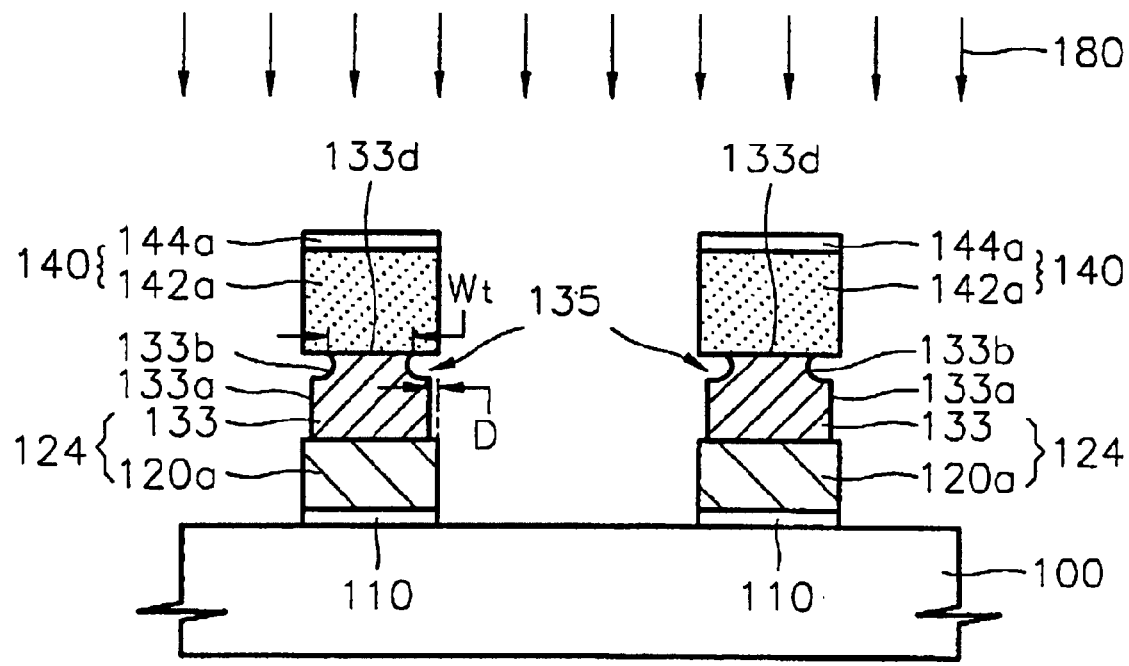

Referring to FIG. 10F, a part of the gate oxide layer 110, which is damaged during the etching process for forming the metal silicide layer patterns 132 and the doped polysilicon layer patterns 120a, is eliminated by a wet-cleaning technique using a hydrofluoric acid (HF) etchant, and thus the surface of the semiconductor substrate 100 is exposed. The removal of the exposed gate oxide layer 110 may be omitted in some cases.

Then, a predetermined width D of the metal silicide layer patterns 132 is removed from the exposed surfaces thereof via a cleaning process using a cleaning solution 180, so that recessed metal silicide layer patterns 133, which are recessed relative to the sidewalls of the doped polysilicon layer patterns 120a or the mask patterns 140. As a result, second gate structures 124, which are comprised of the doped polysilicon layer patterns 120a and the recessed metal silicide layer patterns 133, are obtained.

The SC1 solution which is maintained at a low temperature of 30–60° C., and preferably, at about 50° C., may be used as the cleaning solution 180. Preferably, the SC1 solution contains the $NH_4OH$ of about 0.5–3% and the $H_2O_2$ of about 2–20%, by weight based on the total weight thereof. More preferably, the SC1 solution contains the $NH_4OH$ of about 0.8—1.3% and the $H_2O_2$ of about 5–5.5%, by weight based on the total weight thereof.

Here, the width D of the part of the metal silicide layer patterns 132 removed by the cleaning solution 180, is relatively small. Accordingly, the shape of the metal silicide layer patterns 132 remains, so that the recessed metal silicide layer patterns 133 still have lower edges 133a, which are substantially perpendicular to the major surface of the semiconductor substrate 100, and upper edges 133b which are chamfered due to the undercut regions 135, as do the metal silicide layer patterns 132. The difference between the recessed metal silicide layer patterns 133 and the metal silicide layer patterns 132 is that since the recessed metal silicide layer patterns 133 result from the removal of a portion having a width D from part of the metal silicide layer patterns 132, via the wet cleaning using the cleaning solution 180, the recessed metal silicide layer patterns 133 have a maximum width which is less than the width Wm of the mask pattern 140 and the width of the doped polysilicon layer patterns 120a.

Also, the recessed metal silicide layer patterns 133 have top surfaces 133d with a width which is less than the width Wm of the mask patterns 140 and greater than half of the width Wm.

Figure 10G:
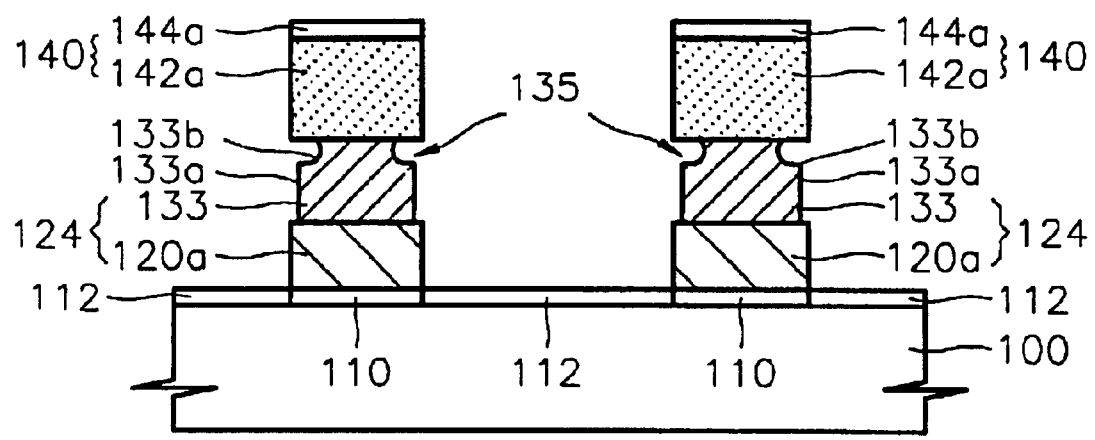

Then, as shown in FIG. 10G, an oxide layer 112 is formed on the exposed surface of the semiconductor substrate 100.

Figure 10H:
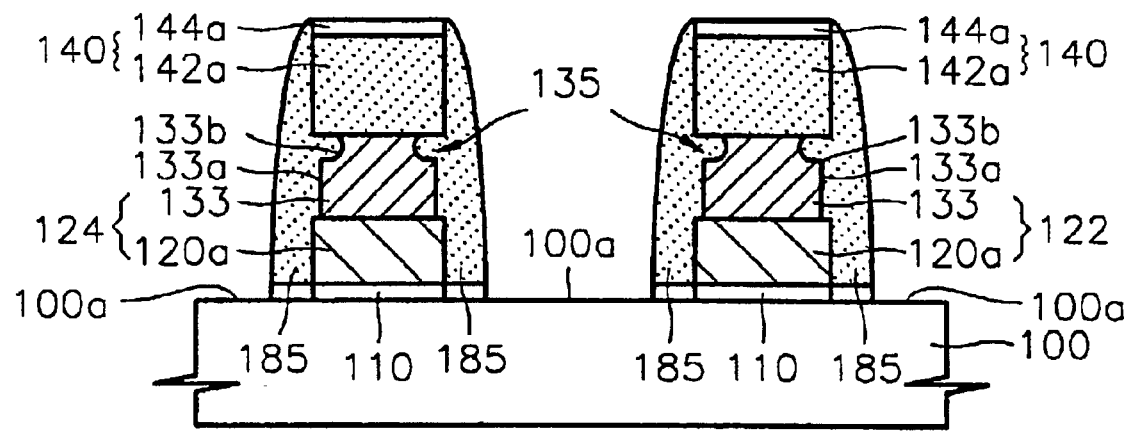

Referring to FIG. 10H, a silicon nitride layer is deposited on the mask patterns 140 underneath which the second gate structures 124 have been formed, and on the oxide layer 112 between the second gate structures 124, and then exposed to an etchback process, so that spacers 185 cover the sidewalls of the mask patterns 140 and the second gate structures 124. During the etchback process for forming the spacers 185, the deposited silicon nitride layer is over etched such that the oxide layer 112 between neighboring spacers is removed, and thus active regions 100a of the semiconductor substrate 100 are exposed.

Figure 10I:
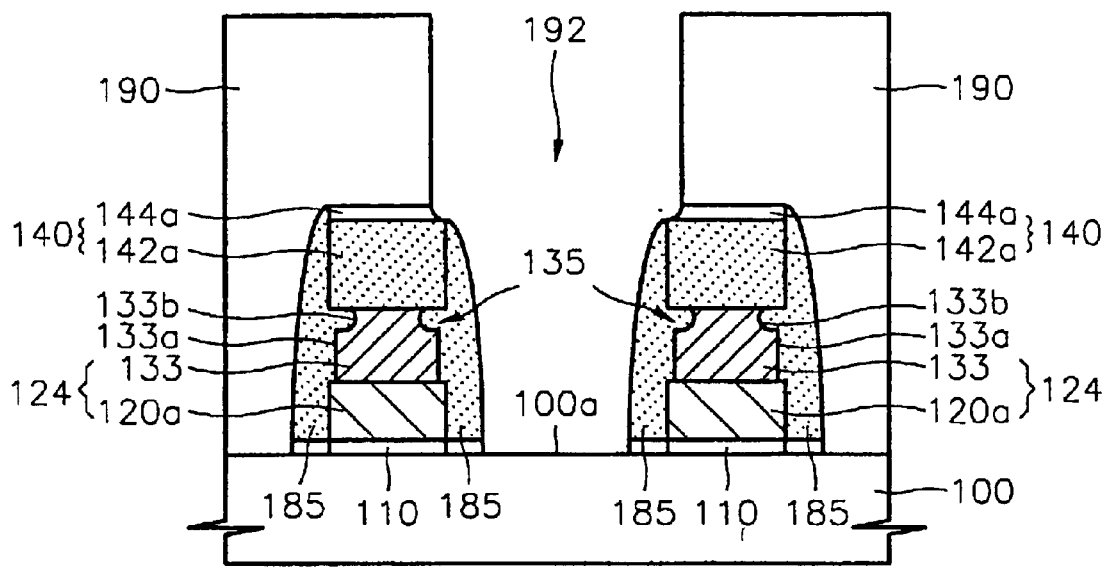

Referring to FIG. 10I, planarized ILD films 190 are deposited on the structure having the spacers 185, and then selectively etched using photoresist pattern (not shown), to thereby form self-aligned contact holes 192 through which both the spacers 185 and the active regions 100a of the semiconductor substrate 100 are exposed.

Figure 10J:
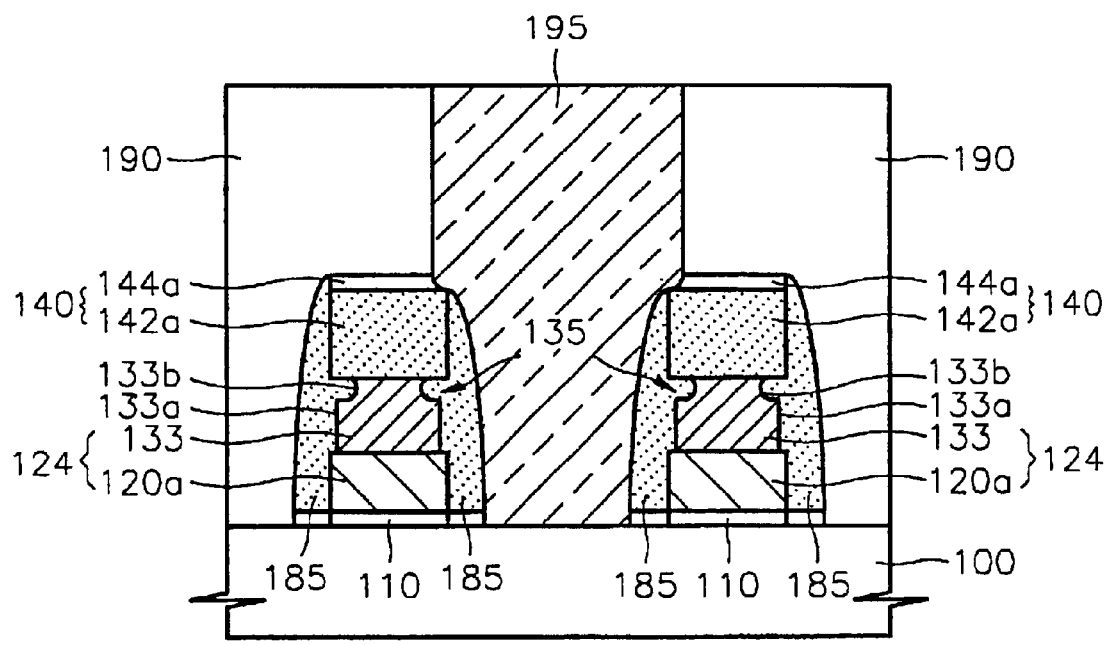

Referring to FIG. 10J, the self-aligned contact holes 192 are filled with a conductive material, for example, doped polysilicon, to thereby form contact plugs 195 which are self-aligned with the second gate structures 124. Since the recessed metal silicide layer pattern 133 of the second gate structures 124 have upper edges 133b which are chamfered due to the undercut regions 135 formed under the overhanging portions of the mask patterns 140, a desired insulation length between the second gate structures 124 and the contact plugs 195 can be ensured by the spacers 185.

FIGS. 11A through 11D are sectional views sequentially illustrating semiconductor device fabrication according to a second preferred embodiment of the present invention. In particular, referring to FIG. 11A, a gate oxide layer 210, a doped polysilicon layer 220 and a metal silicide layer 230 are sequentially deposited on a semiconductor substrate 200, and then mask patterns 240, which are comprised of silicon nitride layer patterns 242a and HTO layers 244a, are formed by using photoresist patterns 260. These processes are carried out in the same manner as in the first embodiment described with reference to FIGS. 10A and 10B.

Figure 11A:
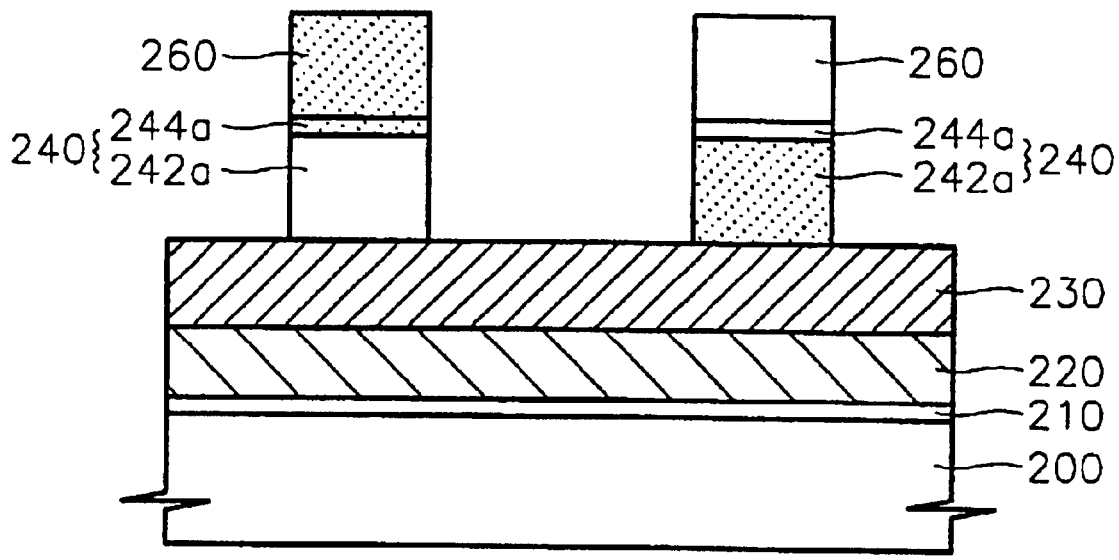
FIGS. 11A through 11D depict the cross-section of a semiconductor device manufactured in accordance with a second preferred embodiment of the present invention.
Figure 11B:
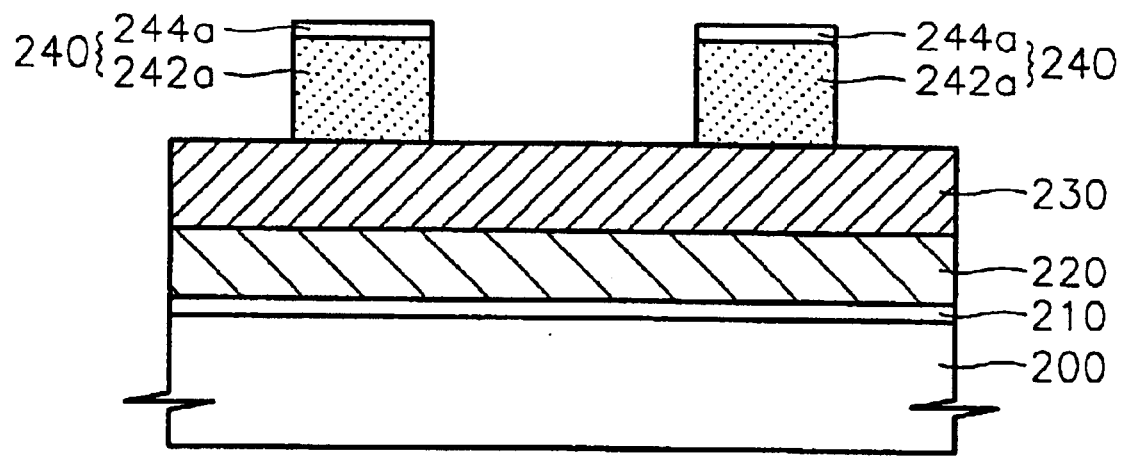

Then, as shown in FIG. 11B, the photoresist patterns 260 are removed by the ashing process described with reference to FIG. 10C.

Figure 11C:
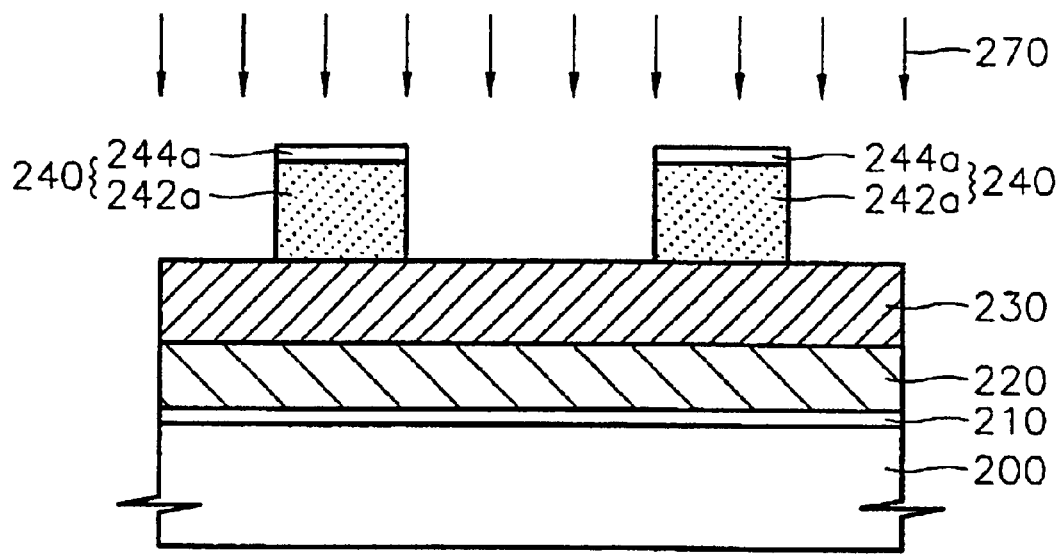

Referring to FIG. 11C, a stripping process is carried out using a predetermined stripping solution 270, which contains a $H_2SO_4$ solution, so as to remove contaminants from the wafer surface, which result from the ashing of the photoresist patterns 260.

Figure 11D:
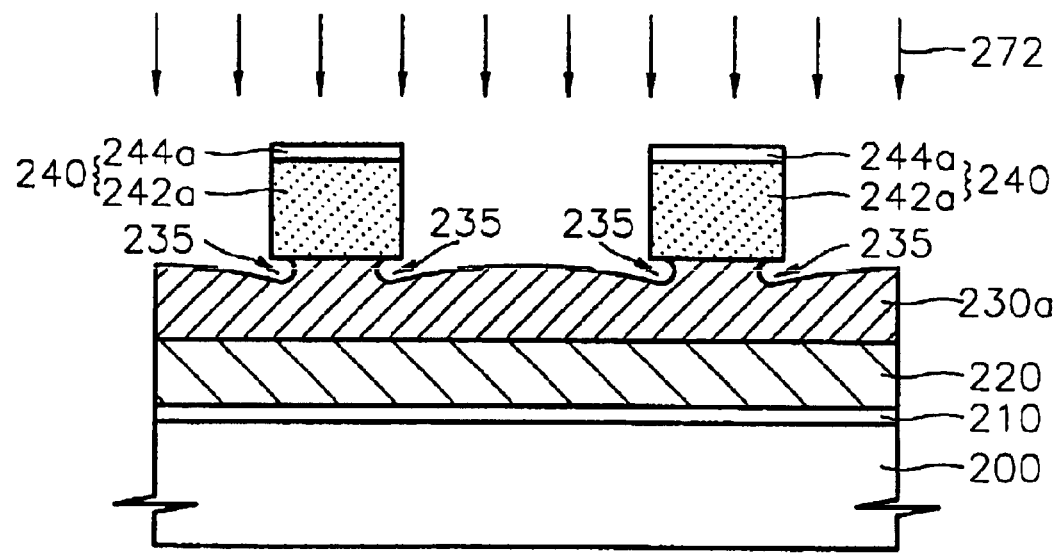

Referring to FIG. 11D, part of the metal silicide layer 230 is exposed to isotropic wet etching by an etchant 272 containing a SC1 solution, wherein the mask patterns 240 are used as an etch mask, to form undercut regions 235 underneath the mask patterns 240, which expose the edges of the bottom of the mask patterns 240. Accordingly, a metal silicide layer 230a with shallow grooves on the top surface thereof due to the undercut regions 235, is formed.

In the isotropic wet etching to the metal silicide layer 230, the temperature of the SC1 solution, which is used as the etchant 272, is maintained at about 30–90° C., and preferably, at about 70° C. Preferably, the SC1 solution contains $NH_4OH$ of about 0.5–3% and $H_2O_2$ of about 2–20%, by weight based on the total weight thereof. More preferably, the SC1 solution contains $NH_4OH$ of about 1.5–2% and $H_2O_2$ of about 3.8–4.5%, by weight based on the total weight thereof.

When the isotropic wet etching process is carried out to the metal silicide layer 230 to form the undercut regions 235, preferably, etching conditions are set such that the ratio of the amount of etching of the metal silicide layer 230 in the lateral direction to that in the vertical direction is greater than 1 (i.e., LAT>VET).

The stripping process described with reference to FIG. 11C and the isotropic wet etching for forming the undercut regions 235 may be continuously carried out in a single cleaning system in which a third bath with the $H_2SO_4$ solution for the stripping process and a fourth bath with the SC1 solution for forming the undercut regions 235, are installed. Here, the continuous stripping and wet etching process may be formed by passing through the first and second baths in turn.

Then, gate structures which have metal silicide layer patterns having the chamfered upper edges thereof, and contact plugs which are self-aligned with the gate structures, are formed in the same manner as described with reference to FIGS. 10E through 10J.

Figure 12:
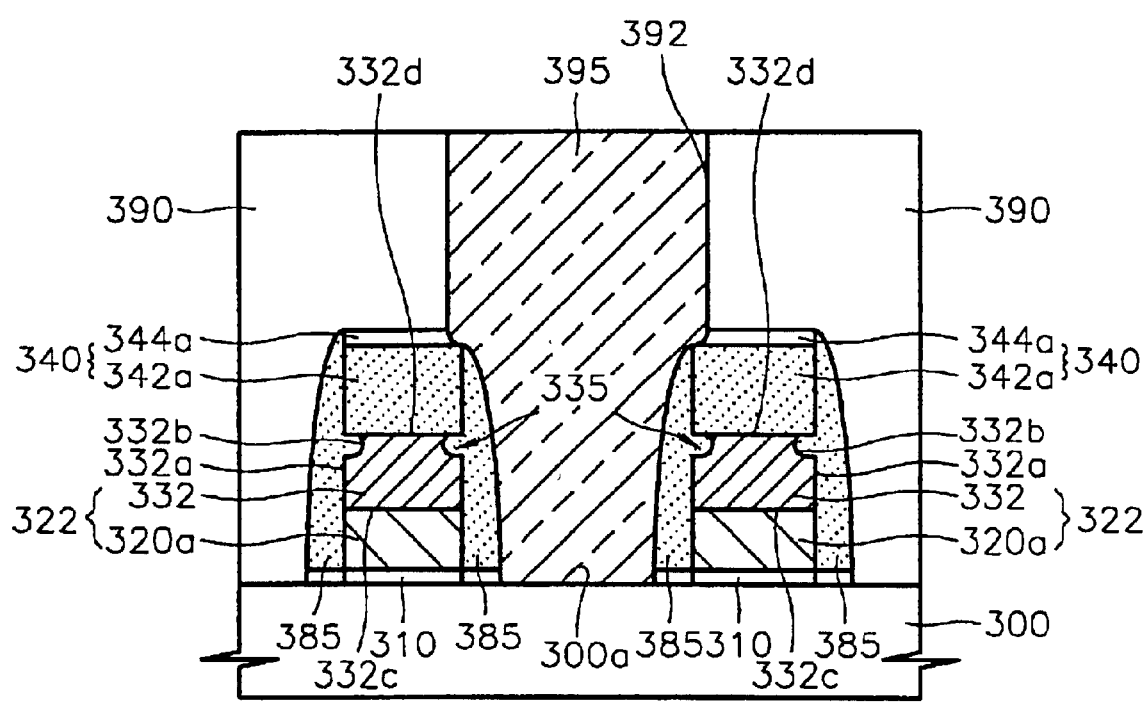
FIG. 12 depicts the cross-section of a semiconductor device manufactured in accordance with a third preferred embodiment of the present invention.

FIG. 12 is a sectional view illustrating semiconductor device fabrication according to a third preferred embodiment of the present invention. The present embodiment is identical to the first embodiment, except that the formation of the recessed metal silicide layer patterns 133, which is described with reference to FIG. 10F, is omitted.

The present embodiment provides gate structures 322, which are formed on a gate oxide layer 310 on a semiconductor substrate 300, and are comprised of doped polysilicon layer patterns 320a and metal silicide layer patterns 332. The metal silicide layer patterns 332 have lower edges 332a which are substantially perpendicular to the major surface of the semiconductor substrate 300, and upper edges 332b which are chamfered due to the undercut regions 335 exposing the edges of the bottom of mask patterns 340.

The mask patterns 340 are comprised of silicon nitride layer patterns 342a and HTO layer patterns 344a. The formation of HTO layer patterns 344a may be omitted in some cases. Also, the metal silicide layer patterns 332 have bottom surfaces 332c with a width which is substantially equal to the width of the mask patterns 340 or the doped polysilicon layer patterns 320a, and top surfaces 332d with a width which is less than the width of the mask patterns 340 and greater than half the width of the mask patterns 340. Here, the maximum width of the metal silicide layer patterns 332 is substantially equal to the width of the mask patterns 340 or the doped polysilicon layer patterns 320a.

In the configuration of the semiconductor device manufactured in the present embodiment, the metal silicide layer patterns 332 of the gate structures 322 are chamfered on the upper edges 332b thereof, due to the undercut regions 335 formed under the overhanging portions the mask patterns 340. Thus, the configuration of the semiconductor device including the spaces 385 can ensure a desired insulation length between the gate structures 322 and contact plugs 395 which fills self-aligned contact holes 392 in contact with active regions 300a of the semiconductor substrate 300, and are self-aligned with the gate structures 322.

FIGS. 13A through 13D are sectional views illustrating semiconductor device fabrication according to a fourth preferred embodiment of the present invention. In particular, referring to FIG. 13A, a gate oxide layer 410 is formed on a semiconductor substrate 400, and then gate structures 424, which are comprised of doped polysilicon layer patterns 420a and recessed metal silicide layer patterns 433, are formed on the gate oxide layer 410, in same manner as in the first embodiment described with reference to FIGS. 10A through 10G. The gate structures 424 are capped with mask patterns 440, which are comprised of silicon nitride layer patterns 442a and HTO layer patterns 444a.

The recessed metal silicide layer patterns 433 have lower edges 433a, which are substantially perpendicular to the major surface of the semiconductor substrate 400, and upper edges 433b with chamfers due to undercut regions 435. The upper edges 433b of the metal silicide layer patterns 433 are recessed by a predetermined width D' from the sidewalls of the doped polysilicon layer patterns 420a and the mask patterns 440.

Figure 13A:
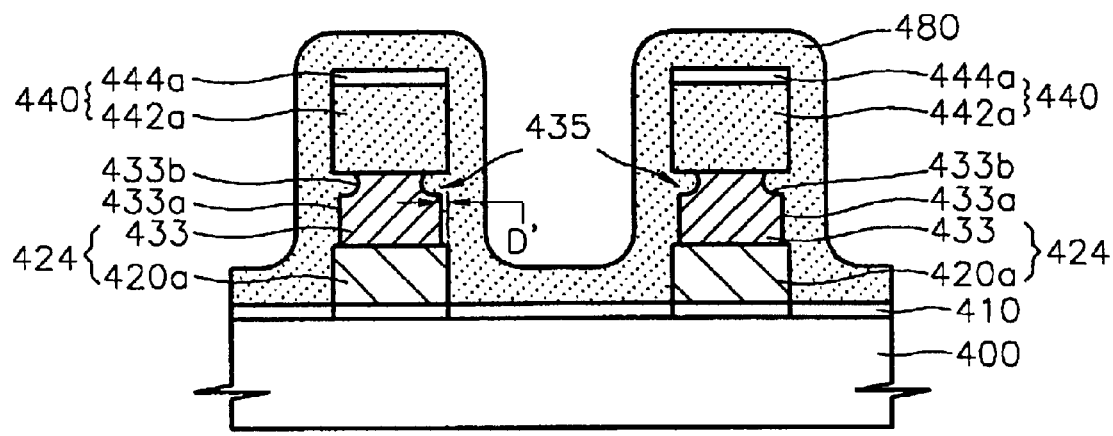
FIGS. 13A through 13D depict the cross section of a semiconductor device manufactured in accordance with a fourth preferred embodiment of the present invention.

Then, as shown in FIG. 13A, the structure with the gate structures 424 is covered with a silicon nitride layer 480.

Figure 13B:
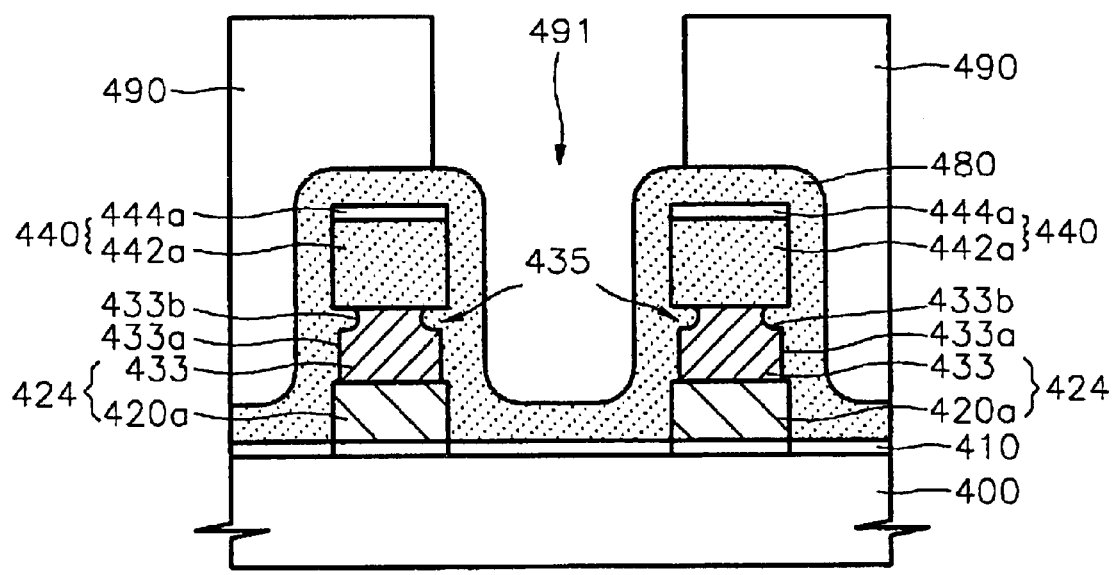

Referring to FIG. 13B, planarized ILD films 490 are deposited on the structure having the silicon nitride layer 480, and then selectively etched using photoresist pattern (not shown), to thereby form openings 491 exposing the surface of the silicon nitride layer 480, which become contact holes later.

Figure 13C:
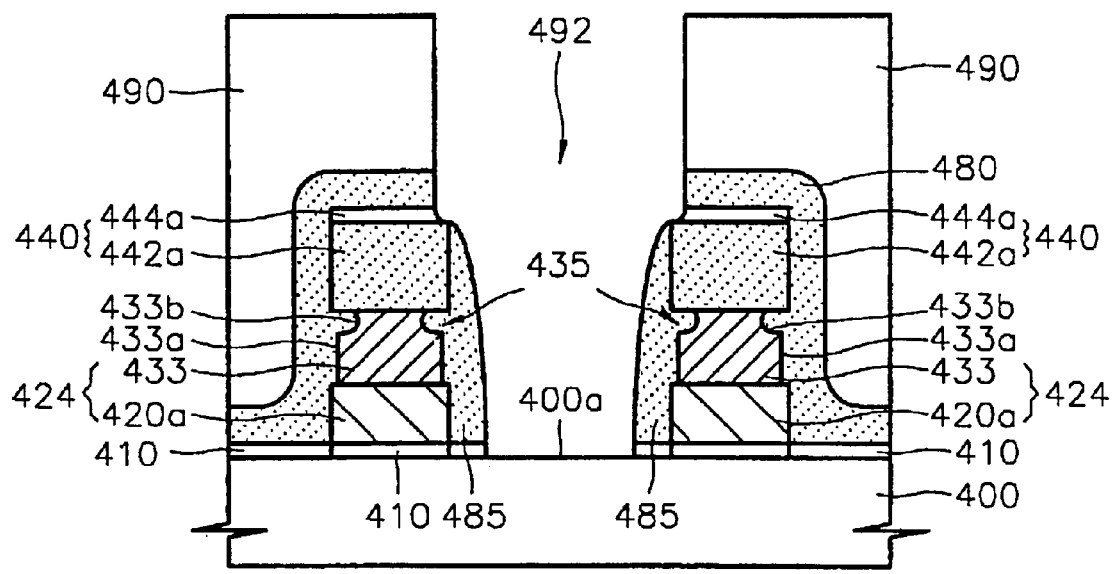

Referring to FIG. 13C, a part of the silicon nitride layer 480 exposed through the openings 491, is etched, to simultaneously form self-aligned contact holes 492 which expose active regions 400a of the semiconductor substrate 400, and spacers 485, which cover the sidewalls of the gate structures 424 and the mask patterns 440, defining the width of the self-aligned contact holes 492.

Figure 13D:
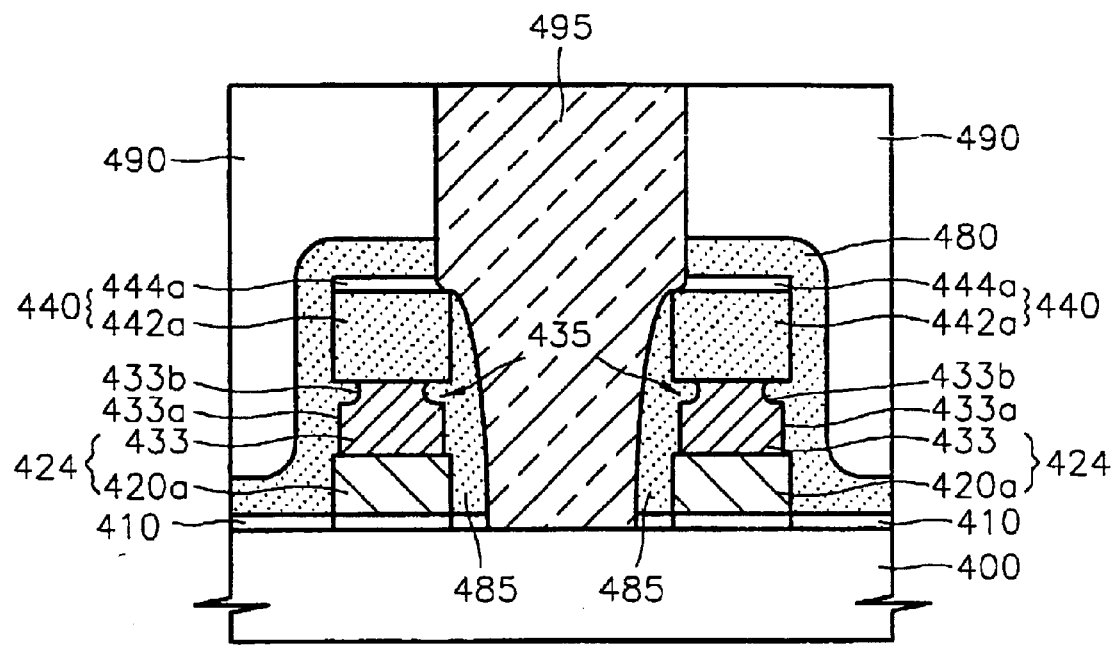

Referring to FIG. 13D, the self-aligned contact holes 492 are filled with a conductive material, for example, doped polysilicon, to thereby form contact plugs 495 which are self-aligned with the gate structures 424.

Figure 14A:
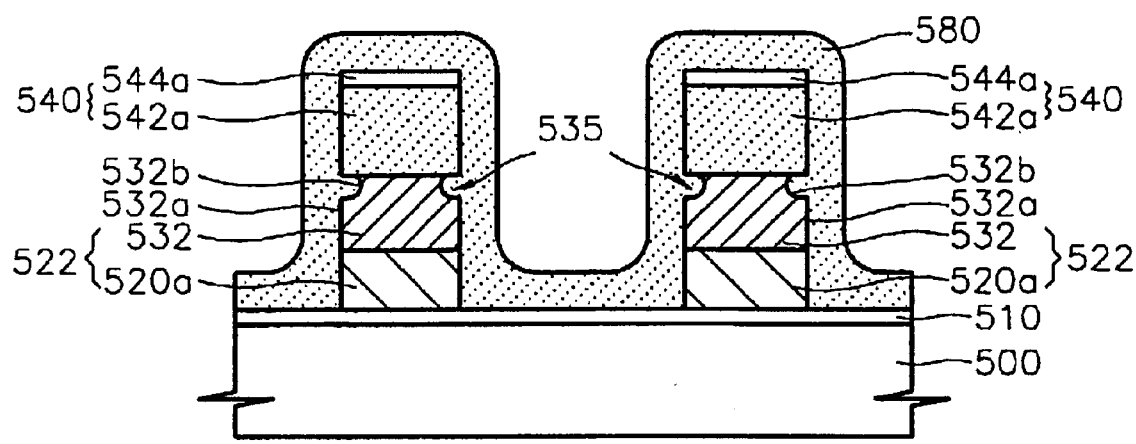
FIGS. 14A and 14B depict the cross section of a semiconductor device manufactured in accordance with a fifth preferred embodiment of the present invention.
Figure 14B:
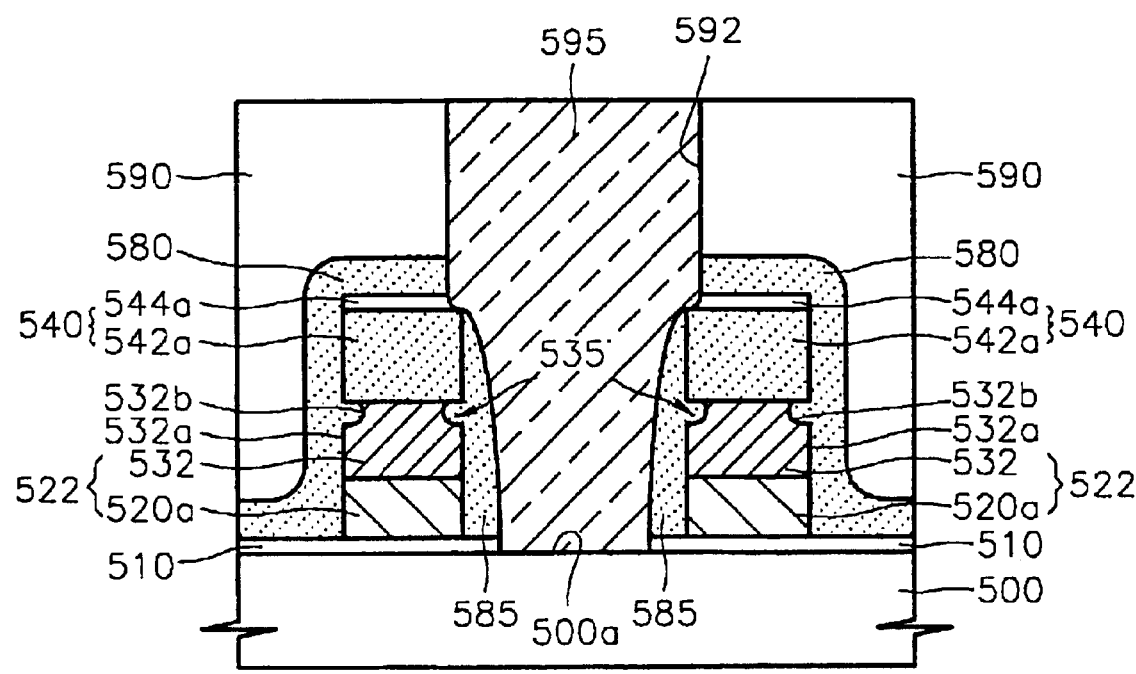

FIGS. 14A and 14B are sectional views illustrating semiconductor device fabrication according to a fifth preferred embodiment of the present invention. As in the third embodiment described with reference to FIG. 12, the present embodiment provides gate structures 522, which are formed on a gate oxide layer 510 on a semiconductor substrate 500, and are comprised of doped polysilicon layer patterns 520a and metal suicide layer patterns 532. The metal silicide layer patterns 532 have lower edges 532a which are substantially perpendicular to the major surface of the semiconductor substrate 500, and upper edges 532b with chamfers due to undercut regions 535 exposing the edges of the bottom of mask patterns 540. Here, the mask patterns 540 are comprised of silicon nitride layer patterns 542a and HTO layer patterns 544a. The metal silicide layer patterns 532 have a maximum width, which is substantially equal to the width of the mask pattern 540 or the doped polysilicon layer patterns 520a.

Then, a silicon nitride layer 580 is formed on the entire surface of the structure having the gate structures 522 as in the fourth embodiment illustrated in FIG. 13A.

Referring to FIG. 14B, self-aligned contact holes 592, which expose active regions 500a of the semiconductor substrate 500 through planarized ILD films 590, and spacers 585 on the sidewalls of the gate structures 522 and the mask patterns 540, are simultaneously formed. Then, the self-aligned contact holes 592 are filled with contact plugs 595 which are self-aligned with the gate structures 522. These processes are performed in the same manner as in the fourth embodiment described with reference to FIGS. 13B through 13D.

Figure 15A:
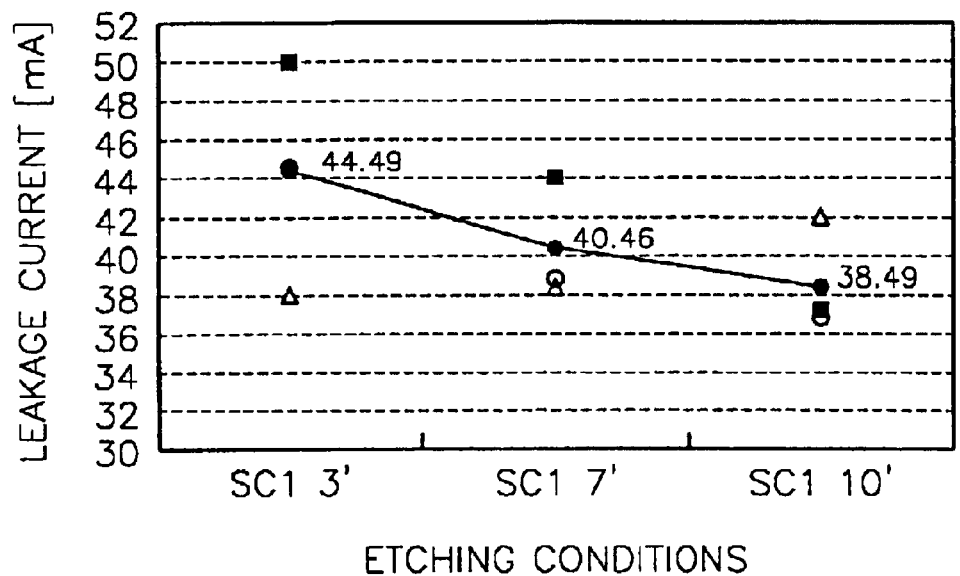
FIGS. 15A and 15B are graphs showing the electrical properties of a semiconductor device manufactured by a method according to the present invention.
Figure 15B:
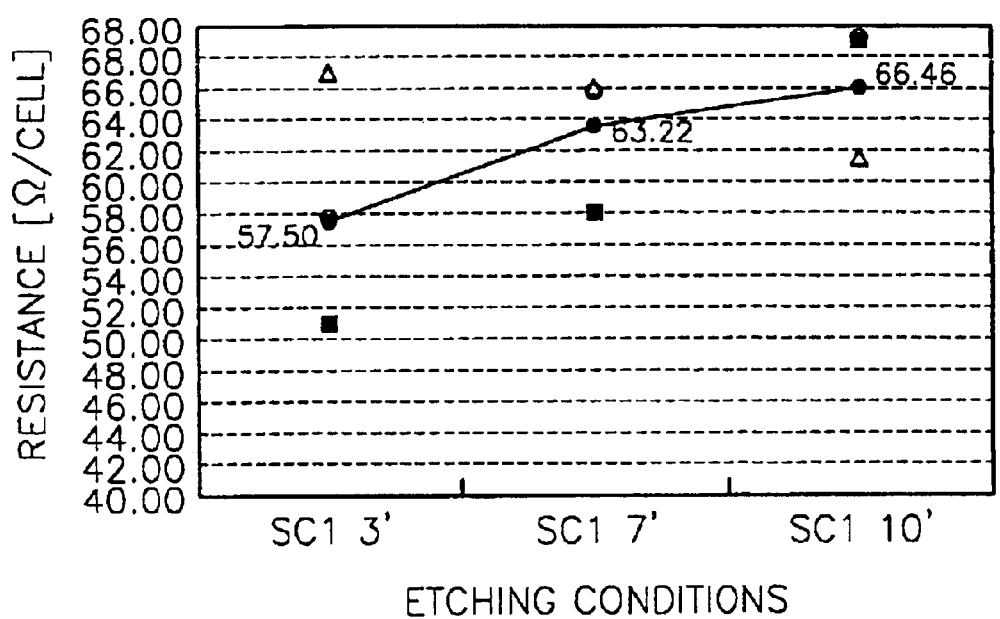

FIGS. 15A and 15B are graphs illustrating the results of evaluating the electrical properties of the semiconductor device manufactured by the method according to the second embodiment of the present invention.

In detail, the undercut regions were formed below the overhanging portions of the mask patterns by the isotropic wet etching process using the 70° C.-SC1 solution as an etchant. Here, the SC-1 solution contained $NH_4OH$ of 1.7% and $H_2O_2$ of 4.1%, by weight based on the total weight thereof. The isotropic wet etching for forming the undercut regions was carried out for 3, 7 and 10 minutes, with the SC1 solution, thus resulting in semiconductor devices. Then, a voltage of 5 V was applied to the semiconductor devices to measure leakage current between the gate structures which had the metal silicide layer patterns with the chamfered upper edges, and the contact plugs which were self-aligned with the gate structures. Also, resistance of transistors with the gate structures was measured. These results are shown in FIGS. 15A and 15B, respectively.

In FIGS. 15A and 15B, the symbol ○ represents a measurement at the position indicated by the number "6" in FIG. 9B of the wafer, and the symbol ■ represents a measurement at the position indicated by the number "3". Also, the symbol ● represents the average measurement of all the nine positions of the wafer. As shown in FIG. 15A, when a voltage of 5 V was applied, the average leakage current was 44.49 mA for the sample SC1 3' (etched for 3 minutes), 40.46 mA for the sample SC1 7' (etched for 7 minutes), and 38.39 mA for the sample SC1 10' (etched for 10 minutes). Thus, it can be concluded that the leakage current of the semiconductor device is within an allowable range.

In addition, as shown in FIG. 15B, the average resistance was 57.50 Ω/cell for the sample SC1 3', 63.22 Ω/cell for the sample SC1 7', and 66.46 Ω/cell for the sample SC1 10'. This result says that the cell resistance is within an allowable range, without adversely affecting device operation.

Figure 15C:
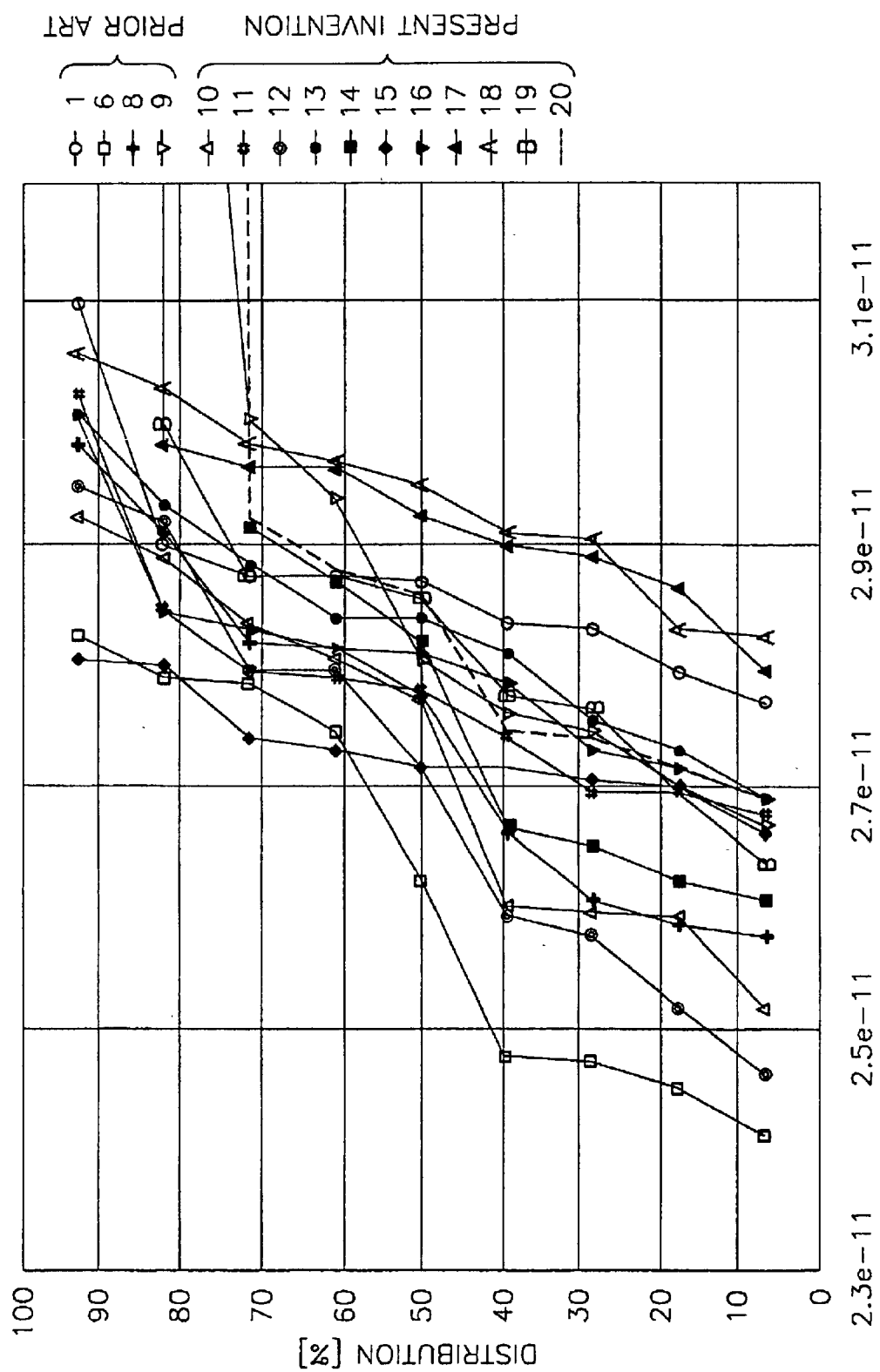
FIG. 15C is a graph comparatively showing the leakage current distribution in the semiconductor device according to the present invention and in a conventional semiconductor device.

FIG. 15C is a graph comparatively showing the leakage current distribution of semiconductor devices according to the present invention and a conventional method. In the legend of FIG. 15C, the numbers represent various positions on wafers where the leakage current was measured.

For measuring the leakage current distribution, a semiconductor device was fabricated using the method according to the second embodiment of the present invention. In detail, after the removal of the photoresist patterns via the ashing process, the isotropic wet etching of the metal silicide layers using the SC1 solution was carried out for 7 minutes, to form the undercut regions near the edges of the bottom of the mask patterns, thus forming the gate structures that include the metal silicide layer patterns with the chamfers on the upper edges thereof. Here, the SC1 solution used as an etchant was prepared to contain $NH_4OH$ of 1.7% and $H_2O_2$ of 4.1%, by weight based on the total weight thereof.

For comparison with the present invention, semiconductor devices, which represent the prior art, were fabricated in the same manner as in the second embodiment according to the present invention, except that after ashing the photoresist patterns, the stripping process with the SC1 solution was carried out by a general technique for 3 minutes such that the metal suicide layer patterns were not chamfered.

As shown in FIG. 15C, the semiconductor device manufactured by the method according to the present invention shows a uniform leakage current distribution as does the conventional semiconductor device, regardless of the position on the wafer, with a smaller gate line width due to the chamfered upper edge of the metal silicide layer pattern than that of the conventional semiconductor device.

That is, the present invention can ensure a sufficient insulation length between the gate structures and the self-aligned contacts, due to the metal silicide layer with the chamfered upper edges, while having a similar leakage distribution to that of the conventional semiconductor device, so that the present invention offers advantages of an increased processing margin compared to in the conventional semiconductor device.

As mentioned above, the gate structures formed of polycide according to the present invention, have metal silicide layer patterns with chamfered upper edges. In addition, if required, the metal silicide layer patterns may be formed with the recessed lower edges, relative to the sidewalls of the underlying doped polysilicon layer patterns, as well as with chamfered upper edges, such that the metal silicide layer patterns have a smaller width than that of the doped polysilicon layer patterns.

Without adverse effects on the electrical properties of devices, the desired insulation length can be ensured by insulation spacers of a sufficient width formed between the gate structures, and the contact plugs which are self-aligned with the gate structures. Thus, the present invention can be adapted to manufacturing highly integrated semiconductor devices with a design rule of 0.25 μm or less.

Also, according to the present invention, bit lines can be formed with the same structure as that of gate structures. For example, in a semiconductor device with a COB structure, contact plugs for connecting capacitors to active regions of a semiconductor substrate, or contact plugs connected to intermediate pads formed over the bit lines, may be formed in a self-aligning manner with the gate structures and the bit lines.

In such a case, a considerable etching stress acts on the spacers on the sidewalls of the bit lines that are located above the gate structures. However, the present invention provide bit lines with chamfered upper edges, so that the spacers on the sidewalls of the bit lines can be maintained with a sufficient insulation width, even after the self-aligned contact holes are completed by etching. Thus, the sufficient insulation length between the contact plugs and either the bit lines or the gate structures can be secured without degrading the electrical properties of devices.

In manufacturing the semiconductor device according to the present invention, which have the gate structures or the bit lines with the above-mentioned features, the fuses can be simultaneously manufactured with the same structure as that of the gate structures or the bit lines.

In the semiconductor device manufacture according to the present invention, the chamfers of the metal silicide layer on the upper edges thereof can be simultaneously formed in the ashing or stripping process for the photoresist patterns, which are essentially carried out to remove the photoresist patterns which are used to pattern the metal silicide layer into the metal silicide layer patterns, without a need to perform additional complicated processes.

In detail, in order to form undercut regions with the contours which define the chamfers to be formed on the upper edges of the metal silicide layer patterns, the isotropic dry etching process can be simultaneously performed with the ashing process or after the ashing process, in the same chamber. Alternatively, once the ashing process is performed to remove the photoresist patterns, a conventional stripping process and the isotropic wet etching process can be carried out in turn in a single rinsing system. Thus, in the present invention, the undercut regions can be formed with a minimum number of processing steps by effectively using the essential processes for manufacturing semiconductor devices.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of manufacturing a semiconductor device, comprising:

forming a first conductive layer on a semiconductor substrate;

forming a second conductive layer on the first conductive layer;

forming first mask patterns on the second conductive layer, the first mask patterns partially exposing the top surface of the second conductive layer;

isotropically etching part of the second conductive layer using the first mask patterns as an etch mask, so as to form first undercut regions exposing the edges of the bottom of the first mask patterns;

anisotropically etching the remaining second conductive layer using the first mask patterns as an etch mask, so as to form second conductive layer patterns which have lower edges substantially perpendicular to the major surface of the semiconductor substrate, and chamfered upper edges;

isotropically etching the first conductive layer using the first mask pattern as an etching mask, so as to form first conductive layer patterns;

exposing the second conductive layer patterns to a cleaning solution that selectively removes portions of the second conductive layer and thereby further recesses the chamfered upper edges and the perpendicular lower edges of the second conductive layer patterns relative to edges of the first conductive layer patterns;

forming an insulation layer on at least sidewalls of the first conductive layer pattern, on sidewalls of the recessed second conductive layer patterns and on sidewalls of the first mask patterns;

forming a first planarized interlayer dielectric (ILD) film on the insulation layer; and selectively etching the first ILD film so as to form self-aligned contact holes exposing an active region of the semiconductor substrate.

2. The method of claim 1, wherein forming the insulation layer comprises:

forming a nitride layer which completely covers the resultant structure having the recessed second conductive layer patterns; and performing an etchback process on the nitride layer so as to form nitride spacers on the sidewalls of the first conductive layer patterns, on the sidewalls of the recessed second conductive layer patterns and on the sidewalls of the first mask patterns, and forming the self-aligned contact holes comprises selectively etching the first ILD film so as to form first ILD layer patterns exposing the nitride spacers.

3. The method of claim 1, wherein forming the insulation layer comprises forming a nitride layer which completely covers the resultant structure having the recessed second conductive layer patterns; and forming the self-aligned contact holes comprises;

selectively etching the first ILD film so as to form a first ILD layer pattern exposing part of the nitride layer; and etching the exposed nitride layer so as to form nitride spacers on the sidewalls of the first conductive layer patterns, the recessed second conductive layer patterns and the first mask patterns, wherein the width of the self-aligned contact holes is confined by the nitride spacers.

4. The method of claim 1, wherein forming the first mask patterns comprises:

forming an insulation layer on the second conductive layer;

forming photoresist patterns on the insulation layer; and anisotropically etching the insulation layer using the photoresist patterns as an etch mask, so as to form the first mask patterns.

5. The method of claim 4, wherein forming the first mask patterns is followed by removing the photoresist patterns via ashing, and the formation of the first undercut regions is simultaneously carried out with the ashing of the photoresist patterns.

6. The method of claim 4, wherein forming the first mask patterns is followed by removing the photoresist patterns via ashing, and the formation of the first undercut regions is continuously carried out immediately after the ashing of the photoresist patterns in the same chamber.

7. The method of claim 4, wherein after forming the first mask patterns, the method further comprises:

removing the photoresist patterns via ashing; and removing residue which results from the ashing, via a stripping process, and forming the first undercut regions is continuously carried out immediately after the stripping process in the same chamber.

8. The method of claim 1, further comprising;

forming a first interlayer dielectric (ILD) film which completely covers the first mask patterns; and forming bit lines on the first ILD film, wherein forming the bit lines comprises:

forming a third conductive layer on the first ILD film;

forming second mask patterns on the third conductive layer, the second mask patterns exposing part of the top surface of the third conductive layer;

isotropically etching part of the exposed third conductive layer using the second mask patterns as an etch mask so as to form second undercut regions exposing the edges of the bottom of the second mask patterns; and anisotropically etching the remaining part of the exposed third conductive layer using the second mask patterns as an etch mask so as to form third conductive layer patterns which have lower edges substantially perpendicular to the major surface of the semiconductor substrate, and chamfered upper edges.

9. The method of claim 8, further comprising wet-etching the third conductive layer patterns by a predetermined width from the exposed edges thereof so as to form recessed third conductive layer patterns which have a maximum width less than the width of the second mask patterns.

10. The method of claim 8, further comprising:

forming first insulation spacers on the sidewalls of the first and second conductive layer patterns and the first mask patterns; and forming second insulation spacers on the sidewalls of the third conductive layer patterns and the second mask patterns.

11. The method of claim 10, wherein the first and second insulation spacers are formed of a nitride layer.

12. The method of claim 10, further comprising:

forming a second ILD film to cover the second mask patterns;

selectively etching the second and first ILD films so as to form self-aligned contact holes exposing the first and second insulation spacers and active region of the semiconductor substrate; and filling the self-aligned contact holes with a conductive material so as to form contact plugs in a self-aligning manner with the first and second conductive patterns and the bit lines.

* * * * *